United States Patent
Poulin et al.

(10) Patent No.: US 10,418,951 B2
(45) Date of Patent: *Sep. 17, 2019

(54) COMBINED OUTPUT MATCHING NETWORK AND FILTER FOR POWER AMPLIFIER WITH CONCURRENT FUNCTIONALITY

(71) Applicant: Skyworks Solutions, Inc., Woburn, MA (US)

(72) Inventors: Grant Darcy Poulin, Carp (CA); Apostolos Samelis, Bishop's Stortford (GB); Edward John Wemyss Whittaker, Bishop's Stortford (GB)

(73) Assignee: Skyworks Solutions, Inc., Woburn, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/071,518

(22) Filed: Mar. 16, 2016

(65) Prior Publication Data

US 2016/0285503 A1  Sep. 29, 2016

Related U.S. Application Data

(60) Provisional application No. 62/137,574, filed on Mar. 24, 2015, provisional application No. 62/165,604, filed on May 22, 2015.

(51) Int. Cl.
*H03F 1/32* (2006.01)
*H03F 1/56* (2006.01)
(Continued)

(52) U.S. Cl.
CPC .......... *H03F 3/245* (2013.01); *H03F 1/3205* (2013.01); *H03F 1/565* (2013.01); *H03F 3/193* (2013.01);
(Continued)

(58) Field of Classification Search
CPC .... H04B 1/44; H04B 1/48; H04B 2001/0408; H04B 2001/485; H04B 1/0261;
(Continued)

(56) References Cited

U.S. PATENT DOCUMENTS 5,969,575 A    10/1999  Helms
6,166,599 A *  12/2000  Aparin .................. H03F 1/3241
                                              330/149
(Continued)

FOREIGN PATENT DOCUMENTS

CN    103580610 A    2/2014
GB    2 292 278 A    2/1996
(Continued)

OTHER PUBLICATIONS

Search Report under Section 17(5), dated Sep. 21, 2016 for Application No. GB1604729.2, 1 page.
(Continued)

*Primary Examiner* — Yuwen Pan
*Assistant Examiner* — Paul P Tran
(74) *Attorney, Agent, or Firm* — Knobbe, Martens, Olson & Bear, LLP

(57) ABSTRACT

Disclosed are systems and methods related to reducing intermodulation products in an RF output signal by matching an impedance of the power amplifier to an impedance of the antenna and concurrently blocking signals having a second fundamental frequency received by the antenna when the antenna is transmitting to inhibit intermodulation products of the first and second fundamental frequencies from re-radiating from the antenna. The matching and blocking are performed concurrently by a single circuit with combined matching and blocking functionality.

22 Claims, 11 Drawing Sheets

(51) Int. Cl.
  *H03F 3/24* (2006.01)
  *H04B 1/44* (2006.01)
  *H03F 3/193* (2006.01)
  *H03F 3/195* (2006.01)
  *H04B 1/04* (2006.01)
  *H04B 1/48* (2006.01)

(52) U.S. Cl.
  CPC ............... *H03F 3/195* (2013.01); *H03F 3/24* (2013.01); *H04B 1/44* (2013.01); *H03F 2200/171* (2013.01); *H03F 2200/294* (2013.01); *H03F 2200/387* (2013.01); *H03F 2200/451* (2013.01); *H04B 2001/0408* (2013.01); *H04B 2001/485* (2013.01)

(58) Field of Classification Search
  CPC .... H04B 1/0277; H04B 1/0458; H04B 1/406; H04B 1/525; H03F 1/3205; H03F 1/565; H03F 3/193; H03F 3/195; H03F 3/245; H03F 2200/171; H03F 2200/294; H03F 2200/387; H03F 2200/451; H03F 1/0222; H03F 1/0227; H03F 1/0277; H03F 1/486; H03F 1/56; H03F 3/19; H03F 3/21; H03F 3/211; H03F 3/72; H03F 3/04; H03F 3/14; H03F 3/24; H03F 3/68; H03F 3/171; H03F 3/294; H03F 3/387; H03F 3/451; H04W 52/367; H03H 7/46; H05K 1/09
  USPC ...... 455/78, 82, 83, 84, 88, 107, 248.1, 320; 257/531, 666; 330/107, 149, 286, 302, 330/305; 375/296
  See application file for complete search history.

(56) References Cited

U.S. PATENT DOCUMENTS

| | | | | |
|---|---|---|---|---|
| 6,424,226 | B1* | 7/2002 | Thuis | H03F 1/32 330/294 |
| 8,497,744 | B1* | 7/2013 | Wright | H03H 7/38 333/138 |
| 8,606,198 | B1 | 12/2013 | Wright | |
| 2004/0041634 | A1* | 3/2004 | Sugiura | H03F 1/565 330/302 |
| 2004/0075504 | A1 | 4/2004 | Vintola | |
| 2004/0152426 | A1* | 8/2004 | Suzuki | H04B 1/48 455/83 |
| 2005/0003855 | A1* | 1/2005 | Wada | H04B 1/005 455/552.1 |
| 2007/0080750 | A1 | 4/2007 | Liebenrood | |
| 2007/0096804 | A1 | 5/2007 | Bakalski | |
| 2008/0026709 | A1* | 1/2008 | Liu | H04B 1/0067 455/121 |
| 2010/0321086 | A1* | 12/2010 | See | H04B 1/0458 327/359 |
| 2011/0003566 | A1 | 1/2011 | Makihara | |
| 2011/0037516 | A1* | 2/2011 | Nejati | H03F 1/565 330/124 R |
| 2011/0237188 | A1* | 9/2011 | Sen | H04B 15/00 455/41.2 |
| 2012/0075023 | A1 | 3/2012 | Guo | |
| 2012/0229217 | A1 | 9/2012 | Kawano et al. | |
| 2013/0049735 | A1 | 2/2013 | Shafer | |
| 2013/0154735 | A1* | 6/2013 | Hase | H03F 3/191 330/192 |
| 2014/0002187 | A1 | 1/2014 | McPartlin et al. | |
| 2014/0002188 | A1* | 1/2014 | Chen | H03F 3/19 330/250 |
| 2014/0073267 | A1 | 3/2014 | Cabanillas et al. | |
| 2014/0167856 | A1* | 6/2014 | Takahashi | H03F 1/0277 330/295 |
| 2014/0197892 | A1 | 7/2014 | Gorbachov | |
| 2014/0266459 | A1 | 9/2014 | Scott | |
| 2014/0312976 | A1 | 10/2014 | Noori et al. | |
| 2015/0028945 | A1* | 1/2015 | Gaynor | H03F 3/189 330/107 |
| 2015/0065070 | A1* | 3/2015 | Maxim | H03F 1/565 455/95 |
| 2015/0137891 | A1 | 5/2015 | Xuan | |
| 2015/0333706 | A1 | 11/2015 | Blednov | |
| 2016/0285425 | A1 | 9/2016 | Poulin et al. | |

FOREIGN PATENT DOCUMENTS

| | | |
|---|---|---|
| JP | 2006-526315 | 11/2006 |
| JP | 2014-090222 | 5/2014 |
| WO | WO 01/05042 A1 | 1/2001 |
| WO | WO2014/013868 | 1/2014 |

OTHER PUBLICATIONS

Search Report Under Section 17(6) dated Aug. 25, 2017 for Application No. GB1604729.2, in 3 pages.
Japanese Office Action for Application No. 2016-100960, dated Jun. 25, 2019, in 3 pages with English translation.

* cited by examiner

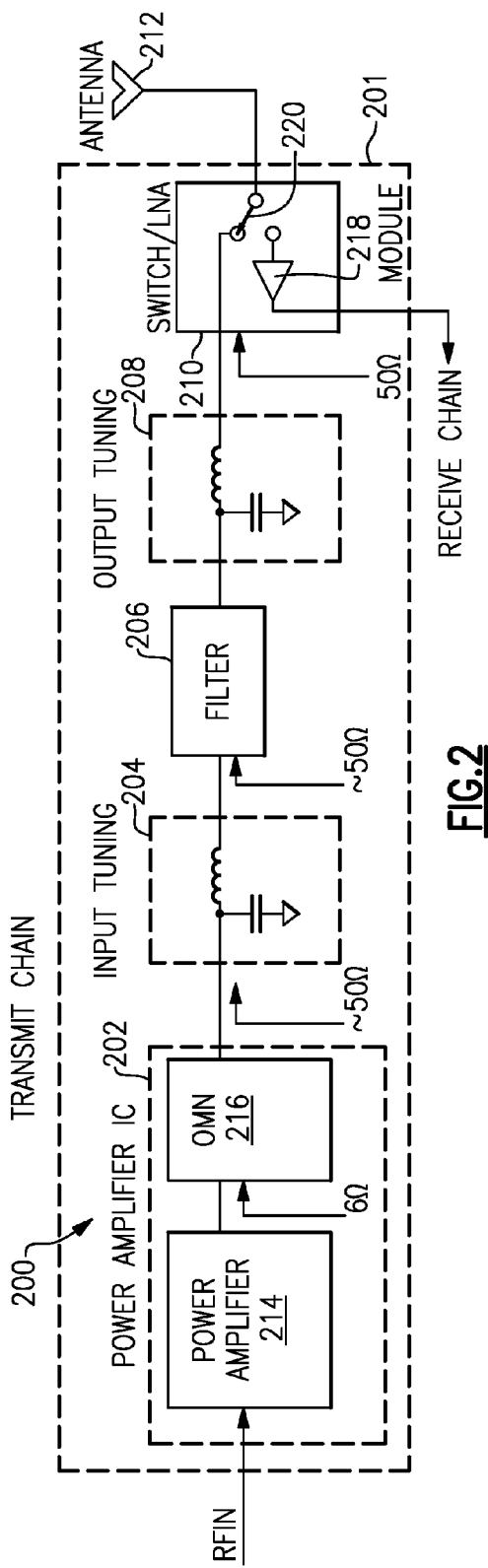
FIG.2
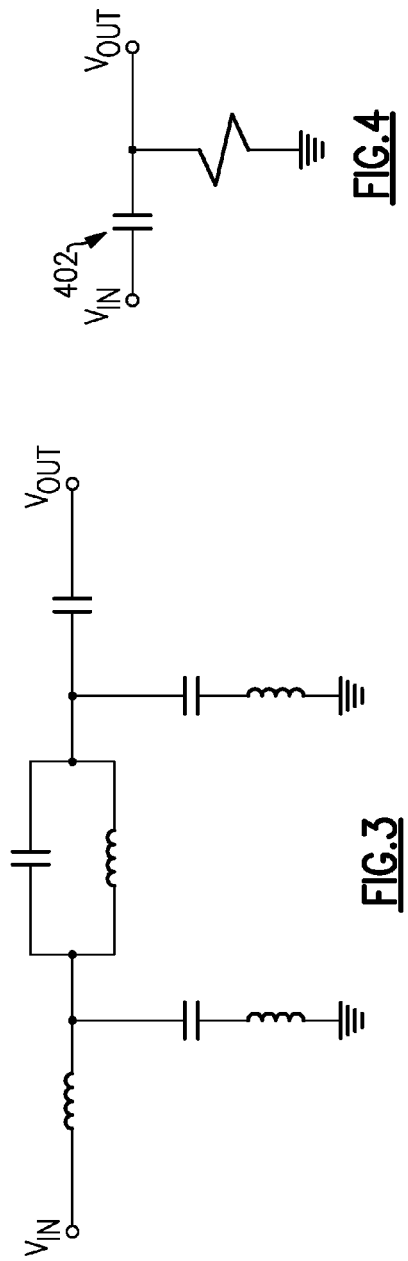
FIG.3
FIG.4

COMBINED OUTPUT MATCHING NETWORK AND FILTER FOR POWER AMPLIFIER WITH CONCURRENT FUNCTIONALITY

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

Embodiments of the invention relate to electronic systems, and in particular, to radio frequency (RF) electronics.

Description of the Related Technology

Radio frequency (RF) power amplifiers can be used to boost the power of a RF signal having a relatively low power. Thereafter, the boosted RF signal can be used for a variety of purposes, included driving the antenna of a transmitter.

Power amplifiers can be included in mobile devices to amplify an RF signal for transmission by the antenna. To maximize the power transfer from the amplified RF signal to the antenna, which can also be characterized as minimizing signal reflections from the antenna into the amplified RF signal, RF circuits typically employ impedance matching. The maximum signal power is delivered into the antenna when the impedance of the antenna is equal to the impedance of the power amplifier.

Further, RF circuits typically employ filters to enable the desired frequencies to be passed through the circuit, while rejecting those that are not needed. Thus, power amplifiers, such as those in mobile devices, are often associated with output matching networks (OMNs) that are optimized to match the impedance of the antenna and filters that are optimized to reject signals with frequencies that are not intended to be transmitted or received by the antenna.

SUMMARY

According to a number of implementations, the present disclosure relates to a module comprising a first terminal configured to receive a radio frequency (RF) input signal, a second terminal configured to provide an amplified RF signal to a first antenna for transmission, a power amplifier die including an amplifier circuit configured to amplify the RF input signal and an input pad electrically connected to the first terminal, where the power amplifier die excludes an output matching network, a filter die including a concurrent output matching network and filter circuit configured to concurrently transform an output impedance of the power amplifier to an input impedance of the antenna and to block signals received by the first antenna while the first antenna is transmitting, and a plurality of interconnections configured to electrically connect an input of the concurrent output matching network and filter circuit to an output of the amplifier circuit and to electrically connect an output of the concurrent output matching network and filter circuit to the second terminal.

In some embodiments, the RF input signal has a first fundamental frequency and the blocked signals have a second fundamental frequency. In other embodiments, the blocked signals are transmitted by a second antenna in close physical proximity to the first antenna. In further embodiments, the concurrent output matching network and filter circuit is configured to block signals with the second fundamental frequency from traveling to the amplifier circuit to prevent intermodulation products of the first and the second fundamental frequencies from re-radiating from the first antenna. In an embodiment, a wireless mobile device comprises the module.

In some implementations, the present disclosure relates to a wireless mobile device comprising an antenna configured to receive and transmit radio frequency (RF) signals, a power amplifier configured to amplify an RF input signal, where the power amplifier includes an input configured to receive the RF input signal and an output configured to provide an amplified RF signal, a transmit/receive switch configured to pass the amplified RF signal to the antenna for transmission, and an output matching network and filter circuit with concurrent functionality electrically connected between the output of the power amplifier and the antenna, where the output matching network and filter circuit are configured to transform an output impedance of the power amplifier to an input impedance of the antenna and concurrently block signals received by the antenna when the transmit/receive switch is configured to transmit.

In some embodiments, the output matching network and filter circuit is implemented on a first die and the power amplifier is implemented on a second die. In other embodiments, passive components of the output matching network and filter circuit are implemented using integrated passive device (IPD) technology. In further embodiments, circuitry on the power amplifier die excludes impedance matching functionality. In yet further embodiments, the second die is fabricated using silicon germanium (SiGe) technology.

In accordance with some implementations, the present disclosure relates to an apparatus comprising a first inductor and a first capacitor connected in parallel forming a first parallel combination that includes a first terminal and a common terminal, a second inductor and a second capacitor connected in parallel forming a second parallel combination that includes a second terminal and the common terminal, where the first parallel combination is connected in series with the second parallel combination at the common terminal. The apparatus further comprises a third capacitor connected in series with a third inductor, where the series combination of the third capacitor and the third inductor is coupled between the common terminal and ground, a fourth inductor connected between the first parallel combination at the first terminal and ground, and a fifth inductor connected between the second parallel combination at the second terminal and ground.

In some embodiments, the first and second capacitors and the first, second, third, fourth, and fifth inductors form a combined impedance matching network and filter with concurrent functionality. In other embodiments, the combined impedance matching network and filter is configured to transform an output impedance at the first terminal to the input impedance at the second terminal and to concurrently filter second signals propagating from the second terminal to the first terminal. In further embodiments, the combined impedance matching network and filter transforms an output impedance of a power amplifier to match an input impedance of an antenna that is configured to transmit the amplified radio frequency signal.

In some embodiments, the radio frequency signal has a first fundamental frequency and the second signals have a second fundamental frequency and are received by the antenna while the antenna is transmitting the radio frequency signal. In other embodiments, the first and second capacitors and the first, second, third, fourth, and fifth inductors are implemented using integrated passive device (IPD) technology. In an embodiment, a wireless mobile device comprises the apparatus.

In a number of teachings, the present disclosure relates to a method to reduce intermodulation products in a radio frequency (RF) output signal. The method comprises receiving along a radio frequency (RF) path at an input to a power amplifier circuit an RF signal having a first fundamental frequency in a band of operating frequencies, amplifying the RF signal to provide an amplified RF signal for transmission by an antenna in the RF path, and matching an impedance of the power amplifier to an impedance of the antenna and concurrently blocking signals having a second fundamental frequency received by the antenna when the antenna is transmitting to inhibit intermodulation products of the first and second fundamental frequencies from re-radiating from the antenna, where the matching and blocking is performed concurrently by a single circuit with combined matching and blocking functionality. In some embodiments, matching the impedance includes transforming the output impedance of the power amplifier to the input impedance of the antenna, and blocking signals includes filtering signals propagating along the RF path from the antenna to the power amplifier.

In some implementations, the present disclosure relates to a module comprising a first terminal configured to receive a radio frequency (RF) input signal, a second terminal configured to provide an amplified RF signal to an antenna for transmission, a first die including an amplifier circuit configured to amplify the RF input signal and an input pad electrically connected to the first terminal, a second die including an output matching network configured to transform an output impedance of the amplifier circuit, and a plurality of interconnections configured to electrically connect an input of the output matching network to an output of the amplifier circuit and to electrically connect an output of the output matching network to the second terminal.

In some embodiments, the output matching network includes a concurrent output matching network and filter circuit configured to concurrently transform the output impedance of the amplifier circuit and to block signals received by the antenna while the antenna is transmitting. In other embodiments, the amplifier circuit includes a power amplifier circuit. In further embodiments, passive components of the output matching network are implemented using integrated passive device (IPD) technology. In yet further embodiments, the first die is fabricated using silicon germanium (SiGe) technology.

According to some implementations, the present disclosure relates to a wireless mobile device comprising an antenna configured to receive and transmit radio frequency (RF) signals, a transmit/receive switch configured to pass an amplified RF signal to the antenna for transmission, and a module including a first terminal configured to receive an RF input signal, a first die including an amplifier circuit configured to amplify the RF input signal and an input pad electrically connected to the first terminal, a second die including an output matching network configured to transform an output impedance of the amplifier circuit, a second terminal configured to provide the amplified RF signal to the transmit/receive switch, and a plurality of interconnections configured to electrically connect an input of the output matching network to an output of the amplifier circuit and to electrically connect an output of the output matching network to the second terminal.

In some embodiments, the output matching network includes a concurrent output matching network and filter circuit configured to concurrently transform the output impedance of the amplifier circuit and to block signals received by the antenna when the transmit/receive switch is configured to transmit. In other embodiments, the amplifier circuit includes a power amplifier circuit. In further embodiments, passive components of the output matching network are implemented using integrated passive device (IPD) technology. In yet further embodiments, the first die is fabricated using silicon germanium (SiGe) technology.

In a number of implementations, the present disclosure relates to a module comprising a first terminal configured to receive a radio frequency (RF) input signal, a second terminal configured to provide an amplified RF signal to a first antenna for transmission, an amplifier circuit configured to amplify the RF input signal, an input pad electrically connected to the first terminal and to an input of the amplifier circuit, a concurrent output matching network and filter circuit configured to concurrently transform an output impedance of the amplifier circuit and to block signals received by the first antenna while the first antenna is transmitting, and a plurality of interconnections configured to electrically connect an input of the concurrent output matching network and filter circuit to an output of the amplifier circuit and to electrically connect an output of the concurrent output matching network and filter circuit to the second terminal.

In some embodiments, a first die includes the amplifier circuit and does not include an output matching network, and a second die includes the concurrent output matching network and filter circuit. In other embodiments, the amplifier circuit includes a power amplifier circuit. In further embodiments, passive components of the output matching network and filter circuit are implemented using integrated passive device (IPD) technology. In yet further embodiments, the RF input signal has a first fundamental frequency and the blocked signals have a second fundamental frequency.

In some embodiments, the blocked signals are transmitted by a second antenna in close physical proximity to the first antenna. In other embodiments, the concurrent output matching network and filter circuit is configured to block signals with the second fundamental frequency from traveling to the amplifier circuit to prevent intermodulation products of the first and the second fundamental frequencies from re-radiating from the first antenna.

According to a number of implementations, the present disclosure relates to an RF power amplifier module comprising an input terminal configured to receive an RF input signal, an output terminal configured to provide an amplified version of the RF input signal, a first semiconductor die including an amplifier circuit configured to amplify the RF input signal, and a first circuit separate from the first semiconductor die, electrically connected between the first semiconductor die and the output terminal, and configured to concurrently transform an output impedance of the amplifier circuit to an input impedance of an antenna and block antenna reflections received at the second terminal.

In an embodiment, the first circuit includes a plurality of integrated passive devices included in a common package. In another embodiment, the first circuit includes a plurality of surface mount devices. In a further embodiment, the first circuit is implemented in a second semiconductor die separate from the first semiconductor die. In a yet further embodiment, first semiconductor die does not include an output matching network.

In an embodiment, the first circuit includes a concurrent output matching network and filter configured to concurrently transform the output impedance of the amplifier circuit from approximately 6 ohms to approximately 50 ohms, and block the antenna reflections received at the second terminal. In another embodiment, the first semiconductor die includes a first output matching network configured to transform the output impedance of the amplifier circuit from approximately 6 ohms to approximately 12 ohms. In a further embodiment, the first circuit includes a concurrent output matching network and filter circuit configured to concurrently transform the output impedance of the first output matching network from approximately 12 ohms to approximately 50 ohms, and block the antenna reflections received at the second terminal.

In an embodiment, the first circuit includes a first inductor and a first capacitor connected in parallel forming a first parallel combination between the input of the first circuit and a common terminal, and a second inductor and a second capacitor connected in parallel forming a second parallel combination between the output of the first circuit and the common terminal, the first parallel combination connected in series with the second parallel combination at the common terminal. In another embodiment, the first circuit further includes a third capacitor connected in series with a third inductor, the series combination of the third capacitor and the third inductor coupled between the common terminal and ground. In a further embodiment, the first circuit further includes a fourth inductor connected between the input of the first circuit and the ground, and a fifth inductor connected between the output of the first circuit and the ground.

In some implementations, the present disclosure relates to a wireless mobile device comprising an antenna configured to receive and transmit RF signals, a transmit/receive switch configured to pass an RF output signal to the antenna for transmission, and an RF power amplifier module including an input terminal configured to receive an RF input signal, an output terminal configured to provide an amplified version of the RF input signal, a first semiconductor die including an amplifier circuit configured to amplify the RF input signal, and a first circuit separate from the first semiconductor die, electrically connected between the first semiconductor die and the output terminal, and configured to concurrently transform an output impedance of the amplifier circuit and block antenna reflections received at the second terminal when the transmit/receive switch is configured to transmit.

In an embodiment, the first circuit includes a plurality of integrated passive devices included in a common package. In another embodiment, the first semiconductor die does not include an output matching network. In a further embodiment, the first circuit includes a concurrent output matching network and filter circuit configured to concurrently transform the output impedance of the amplifier circuit from approximately 6 ohms to approximately 50 ohms, and block the antenna reflections received at the second terminal. In a yet further embodiment, the first semiconductor die includes a first output matching network configured to transform the output impedance of the amplifier circuit from approximately 6 ohms to approximately 12 ohms. In another embodiment, the first circuit includes a concurrent output matching network and filter circuit configured to concurrently transform the output impedance of the first output matching network from approximately 12 ohms to approximately 50 ohms, and block the antenna reflections received at the second terminal.

According to some implementations, the present disclosure relates to a method to reduce intermodulation in an RF output signal. The method comprises receiving along an RF path at an input to a power amplifier circuit an RF input signal having a first fundamental frequency in a band of operating frequencies, amplifying the RF signal to provide an amplified version of the RF input signal for transmission by an antenna in the RF path, and transforming an output impedance of the power amplifier circuit to approximate an input impedance of the antenna and concurrently blocking signals having a second fundamental frequency received by the antenna when the antenna is transmitting to inhibit intermodulation of the first and second fundamental frequencies from re-radiating from the antenna, where the transforming and blocking are performed by a single circuit with concurrent transforming and blocking functionality that is separate from power amplifier circuit configured to amplify the RF signal.

In an embodiment, the power amplifier circuit is implemented on a first semiconductor die and the single circuit is not implemented on the first semiconductor die. In another embodiment, the single circuit is implemented on a second semiconductor die that is separate from the first semiconductor die.

According to a number of implementations, the present disclosure relates to an RF power amplifier module comprising an input terminal configured to receive an RF input signal, an output terminal configured to provide an amplified version of the RF input signal, a first semiconductor die including an amplifier circuit configured to amplify the RF input signal; and an OMN including a first partial OMN and a second partial OMN, where the first partial OMN resides on the first semiconductor die and is configured to match an output impedance of the amplifier circuit to an input impedance of the second partial OMN, and the second partial OMN is electrically connected between the first semiconductor die and the output terminal and is configured to match an output impedance of the first partial OMN with an input impedance of a downstream component.

In an embodiment, the second partial OMN includes a plurality of integrated passive devices included in a common package. In another embodiment, the second partial OMN includes a plurality of surface mount devices. In a further embodiment, the second partial OMN is implemented in a second semiconductor die separate from the first semiconductor die. In a further embodiment, the downstream component is an antenna of a mobile device.

In an embodiment, the second partial OMN is part of a concurrent output matching network and filter circuit configured to both concurrently match the output impedance of the first OMN with the input impedance of the downstream component, and to filter antenna reflections received at the output terminal. In another embodiment, the first partial OMN is configured to step up an output impedance of the power amplifier circuit from an initial value to a stepped-up value that is between approximately 10% and 50% of the input impedance of the downstream component. In a further embodiment, the initial value is approximately 6 ohms and the stepped-up value is approximately 12 ohms. In a yet further embodiment, the input impedance of the downstream component is approximately 50 ohms.

In an embodiment, the module further comprises a filter circuit separate from the first die, electrically connected between the first die and the output terminal, and configured to block antenna reflections received at the output terminal. In another embodiment, the second partial OMN and the filter circuit are implemented on a second semiconductor die separate from the first semiconductor die.

In some implementations, the present disclosure relates to a wireless mobile device comprising, an antenna configured to receive and transmit RF signals, a transmit/receive switch configured to pass an RF output signal to the antenna for transmission, and an RF power amplifier module including an input terminal configured to receive an RF input signal, an output terminal configured to provide an amplified version of the RF input signal, a first semiconductor die including an amplifier circuit configured to amplify the RF input signal, and an OMN including a first partial OMN and a second partial OMN, where the first partial OMN resides on the first semiconductor die and is configured to match an output impedance of the amplifier circuit to an input impedance of the second partial OMN, and the second partial OMN is electrically connected between the first semiconductor die and the output terminal and is configured to match an output impedance of the first partial OMN with an input impedance of a downstream component.

In an embodiment, the second partial OMN is implemented in a second semiconductor die separate from the first semiconductor die. In another embodiment, the second partial OMN is part of a concurrent output matching network and filter circuit configured to both concurrently match the output impedance of the first OMN with the input impedance of the downstream component, and to filter antenna reflections received at the output terminal. In a further embodiment, the first partial OMN is configured to step up an output impedance of the power amplifier circuit from an initial value to a stepped-up value that is between approximately 10% and 50% of the input impedance of the downstream component.

In a yet further embodiment, the RF power amplifier module further includes a filter circuit separate from the first die, electrically connected between the first die and the output terminal, and configured to block antenna reflections received at the output terminal. In an embodiment, the second partial OMN and the filter circuit are implemented on a second semiconductor die separate from the first semiconductor die.

According to some implementations, the present disclosure relates to a method to reduce intermodulation in an RF output signal. The method comprises receiving along an RF path at an input to a power amplifier circuit an RF input signal having a first fundamental frequency in a band of operating frequencies, amplifying the RF signal to provide an amplified version of the RF input signal for transmission by an antenna in the RF path, where an amplifying circuit is configured to amplify the RF signal implemented on a first semiconductor die, and matching an output impedance of the power amplifier circuit to an input impedance of a downstream component with an OMN that includes a first partial OMN and a second partial OMN, where the first partial OMN resides on the first semiconductor die, and the matching includes matching an output impedance of the amplifier circuit to an input impedance of the second partial OMN and matching an output impedance of the first partial OMN with the input impedance of the downstream component.

In an embodiment, the method further comprises blocking signals having a second fundamental frequency received by the antenna when the antenna is transmitting to inhibit intermodulation of the first and second fundamental frequencies from re-radiating from the antenna. In another embodiment, the blocking is performed concurrently with the matching of the output impedance of the first partial OMN with the input impedance of the downstream component.

BRIEF DESCRIPTION OF THE DRAWINGS

FIG. 2 is an exemplary block diagram of an RF transmit path, according to certain embodiments.

FIG. 3 is a circuit diagram of an exemplary output-matching network, according to certain embodiments.

FIG. 4 is a circuit diagram of an exemplary filter circuit, according to certain embodiments.

DETAILED DESCRIPTION OF CERTAIN EMBODIMENTS

The features of the systems and methods will now be described with reference to the drawings summarized above. Throughout the drawings, reference numbers are re-used to indicate correspondence between referenced elements. The drawings, associated descriptions, and specific implementation are provided to illustrate embodiments of the inventions and not to limit the scope of the disclosure.

Figure 1:
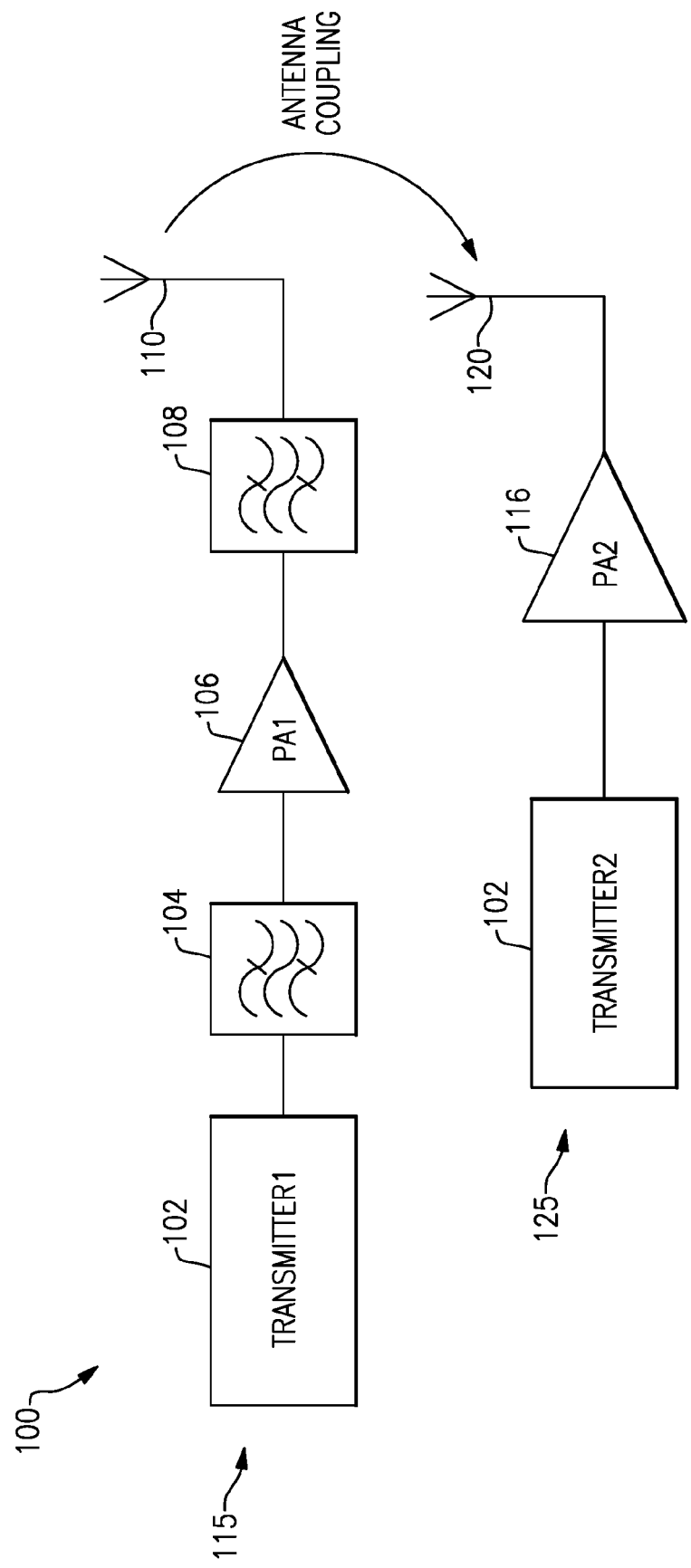
FIG. 1 is an exemplary block diagram of multiple transmit paths in a device, according to certain embodiments.

FIG. 1 is an exemplary block diagram of multiple transmit paths in a device 100. Device 100, for example, may comprise a multi-band mobile device that operates in more than one frequency band. Such a device comprises a separate transmit path for transmissions in each of the frequency bands. In another example, device 100 may comprise a cellular device, such as a smart phone, that has a transmit path for transmitting over the frequency band of its cellular network and has a separate transmit path for transmitting to a local network operating at a different frequency from that of the cellular network.

Device 100 comprises a first transmit path 115 and a second transmit path 125. Other embodiments may comprise more or less than the two transmit paths 115, 125. The first transmit path 115 comprises a first transmitter 102, a filter 104, a first power amplifier 106, a filter 108, and a first antenna 110, and the second transmit path 125 comprises a second transmitter 112, a second power amplifier 116, and a second antenna 120.

The first transmitter 102 generates a first transmit signal at a first frequency or over a first frequency band which is filtered by the filter 104 and amplified by the first power amplifier 106. The amplified signal from the first power amplifier 106 is filtered by the filter 108 and sent to the first antenna 110 for transmission.

Similarly, the second transmitter 112 generates a second transmit signal at a second frequency or over a second frequency band which is amplified by the second power amplifier 116 and sent to the second antenna 120 for transmission. In an embodiment, the first and second frequencies are different and the first and second frequency bands are different and do not overlap.

Mobile devices, cell phones, smart phones, and the like, are typically small devices. Components within the devices' packaging are often placed close to one another. In an embodiment, the first transmit path 115 and the second transmit path 125 are co-located within the device 100 and the first antenna 110 and the second antenna 120 may be located close together. In an embodiment, the first and second antenna 110, 120 may be located within a few centimeters of each other.

When the antennas 110, 120 are physically close to each other, a signal transmitted by the first antenna 110 having the first frequency, in certain embodiments, couples into the second antenna 120. The closer the antennas 110 and 120 are located to each other, the stronger the coupling. Once the signal with the first frequency is received by the second antenna 120, it travels to the second power amplifier 116 and mixes with the second transmit signal having the second frequency. The mixing of the first and second signals results in intermodulation products having frequencies of, for example $(\pm f1 \pm f2)$, $(\pm f1 \pm 2f2)$, $(\pm 2f1 \pm f2)$, $(\pm 2f1 \pm 2f2)$, . . . , $(\pm mf1 \pm nf2)$. The intermodulated signals can then re-radiate through one or more of the first antenna 110 and the second antenna 120 to cause interference at other frequencies.

FIG. 2 is an exemplary block diagram of an RF transmit path 200 comprising a filter 206 configured to block signals from an external antenna. The RF transmit path 200 comprises a power amplifier integrated circuit (IC) 202, an input tuning circuit 204, the filter 206, an output tuning circuit 208, a switch/low noise amplifier (LNA) circuit 210 and an antenna 212. In an embodiment, a module 201, such as a front end module, for example, comprises the power amplifier integrated circuit (IC) 202, the input tuning circuit 204, the filter 206, the output tuning circuit 208, and the switch/ low noise amplifier (LNA) circuit 210. In an embodiment, the external antenna comprises an antenna external to the RF transmit path 200, such as an antenna from a co-located transmit path within the device 100, that couples signals onto the antenna 212 during transmission of the RF transmit signal. In an embodiment, the signals from the external antenna that arrive at the antenna 212 during transmission of the RF transmit signal comprise external blocking signals.

The power amplifier integrated circuit (IC) 202 comprises a power amplifier 214 and an output matching network (OMN) 216 integrated onto a power amplifier die. The power amplifier 214 comprises one or more amplifier stages and is configured to amplify the RF transmit signal.

The OMN 216 transforms the output impedance of the power amplifier 214 to the input impedance of the antenna 212. In an embodiment, the output impedance of the power amplifier 214 is approximately 6 ohms; the input impedance of the antenna is approximately 50 ohms; and the OMN 216 transforms the impedance from approximately 6 ohms to approximately 50 ohms.

In an embodiment, the power amplifier IC 202 comprises active devices, such as the power amplifier 214, and passive devices, such as the components of the OMN 216. The power amplifier 214 is typically implemented on a lossy integrated circuit substrate, such as silicon germanium (SiGe), complementary metal-oxide-semiconductor (CMOS), gallium arsenide (GaAs), silicon carbide (SiC), or other semiconducting materials, for example. When the passive components are implemented on the lossy integrated circuit substrate, they are also subject to the increased losses associated with the lossy integrated circuit substrate.

FIG. 3 is a circuit diagram of an exemplary output-matching network 300 comprising a plurality of inductors and a plurality of capacitors. OMN 300 is an example of an output-matching network that would typically be implemented on the power amplifier IC 202 as the OMN 216. Other embodiments can comprise more or less components than OMN 300, as is known to one of skill in the art from the disclosure herein.

Referring to FIG. 2, the input impedance of the filter 206 is approximately 50 ohms and, in an embodiment, is used to prevent external blocking signals that arrive at the antenna 212 from an external antenna from propagating backwards through the transmit path 200 to the power amplifier 214. In an embodiment, the filter 206 comprises a high-pass filter.

FIG. 4 is a circuit diagram of an exemplary high-pass filter circuit 402 comprising a capacitor and a resistor. In other embodiments, the filter 206 can comprise a low-pass filter, a band-pass filter, or a band-reject filter. In other embodiments, the filter 206 can comprise more than two components or less than two components, as is known to one of skill in the art from the disclosure herein. In an embodiment, the filter 206, 402 is implemented as a discrete device using low temperature co-fired ceramic (LTCC) passive components, external discrete lumped element components, and the like, or as an integrated passive device (IPD) and the like. The filter 206 implemented as a separate circuit uses significant board area and introduces signal losses, which result in increased power consumption.

In an embodiment, the impedance of the filter 206 is not exactly 50 ohms, and matching components are used at the input and the output of the filter 206 to tune the impedance. The input tuning circuit 204 comprises matching components at an input of the filter 206 and the output tuning circuit 208 comprises matching components at an output of the filter 206. In an embodiment, the input tuning circuit 206 comprises at least two passive components and the output tuning circuit comprises at least two passive components.

The switch/LNA circuit 210 has an input impedance of approximately 50 ohms and comprises a low noise amplifier (LNA) 218 and switch 220 configured to switch between transmit and receive modes of the device 100. When the switch 220 is configured in the receive mode, signals received at the antenna 212 are passed through the LNA 218 and onto a receive path. When the switch 220 is configured in the transmit mode, the RF transmit signal in the transmit path 200, having been amplified, filtered, and tuned, is passed to the antenna 212 for transmission.

While the filter 206 blocks signals arriving at the antenna 212 from co-located transmit paths, it can be bulky, uses additional tuning circuits, and expensive to implement on a circuit board. Further, the power amplifier and OMN IC 202 utilizes technology to implement the power amplifier 214, but adds additional signal losses when used to implement the passive components of the OMN 216.

Figure 5A:
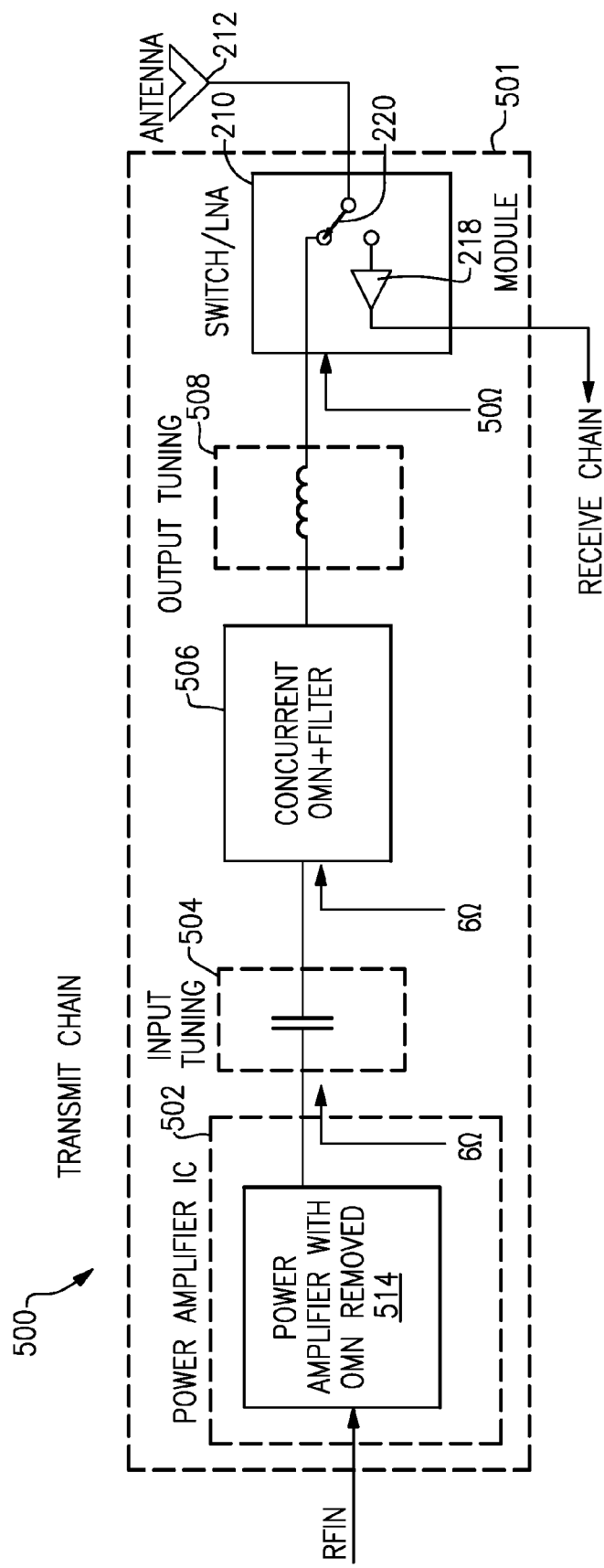
FIGS. 5A and 5B are exemplary block diagrams of an RF transmit path including an embodiment of a combined output-matching network and filter with concurrent functionality, according to certain embodiments.

FIG. 5A is an exemplary block diagram of an RF transmit path 500 comprising a power amplifier IC 502, an input tuning circuit 504, a filter 506, an output tuning circuit 508, the switch/LNA circuit 210 and the antenna 212. The power amplifier IC 502 comprises a power amplifier 514. The power amplifier 514 comprises one or more amplifier stages and is configured to amplify the RF transmit signal.

In an embodiment, a module 501, such as a front end module, comprises the power amplifier IC 502, the input tuning circuit 504, the filter 506, the output tuning circuit 508, and the switch/LNA circuit 210. In another embodiment, the module 501 comprises the power amplifier IC 502, the input tuning circuit 504, the filter 506, and the output tuning circuit 508. In a further embodiment, the module 501 comprises the power amplifier IC 502, the input tuning circuit 504, and the filter 506. In a further embodiment, the module 501 comprises the power amplifier IC 502 and the filter 506.

The filter 506 is configured to transform the impedance of the RF transmit path 500 as the RF signal propagates along the RF transmit path 500 from the power amplifier 514 to the antenna 212 and to concurrently block signals received from an external antenna from traveling from the antenna 212 to the power amplifier 514 along the RF transmit path 500.

An input to the power amplifier IC 502 receives an RF transmit signal from an RF transmitter. An output of the power amplifier IC 502 electrically couples to an input of the filter 506 through the input tuning circuit 504. An output of the filter 506 electrically couples to an input of the switch/LNA 210. When the switch 220 is in the transmit mode, an output of the switch/LNA 210 electrically couples to the antenna 212 such that the amplified, and filtered RF transmit signal is transmitted by the antenna 212.

The power amplifier integrated circuit (IC) 502 comprises the power amplifier 514 integrated onto a power amplifier die. The power amplifier 514 is implemented on a lossy integrated circuit substrate, such as SiGe, CMOS, GaAs, SiC, or other semiconducting materials, for example. In contrast to the power amplifier IC 202, the OMN is moved off the power amplifier die and implemented into the filter 506. The output impedance of the power amplifier IC 502 is approximately 6 ohms. Advantageously, the power amplifier die with the OMN removed is smaller, and less costly, than the power amplifier die that includes the OMN.

The filter 506 is referred to as a concurrent OMN and filter and comprises a combined matching network and filter with concurrent functionality. The concurrent OMN and filter 506 is configured to implement impedance matching and filtering concurrently. It should be noted that the concurrent OMN and filter 506 is not a series OMN followed by a filter. The filter and OMN are combined such that components are functioning as matching components and filtering components concurrently. Since the filter is part of the OMN and vice versa, the overall signal losses are less than the losses incurred when the OMN and filter are implemented separately. Further, the size of the concurrent OMN and filter 506 is less than the combined size of the OMN and filter implemented separately.

In an embodiment, the concurrent OMN and filter 506 is configured to implement 6 ohm to 50 ohm impedance matching and high-pass filtering concurrently. In other embodiments, In other embodiments, the concurrent OMN and filter 506 implements impedance matching between source and load impedances that are less than approximately 6 ohms, greater than approximately 6 ohms, less than approximately 50 ohms or greater than approximately 50 ohms and implements filtering or signal conditioning concurrently, where the concurrent OMN and filter 506 can comprise a high-pass filter, a low-pass filter, a band-pass filter, or a band-reject filter.

In an embodiment, the OMN and filter 506 comprises a first stage and a second stage. The first stage is configured to transform an impedance of approximately 6 ohms to an impedance of approximately 12 ohms and comprises a first portion of a low-pass filter and the second stage is configured to transform an impedance of approximately 12 ohms to an impedance of approximately 50 ohms and comprises a second portion of the low-pass filter, such that the OMN and filter 506 transforms the impedance of a signal from approximately 6 ohms to approximately 50 ohms and also low-pass filters the signal.

In an embodiment, each stage forms a partial OMN where a first partial OMN is configured to step up an output impedance of the power amplifier circuit from an initial value to a stepped-up value that is preferably between approximately 10% and 50% of the input impedance of the downstream component. In other embodiments, the stepped-up value is between 5% and 95%, 10% and 80%, 15% and 75%, 20% and 60%, 30% and 40% and the like, of the input impedance of the downstream component. In other embodiments, other ranges for the stepped-up value can be used. In an embodiment, a second partial OMN is configured to step-up the output impedance of the first partial OMN to the impedance of the downstream component. In an embodiment, the downstream component is an antenna.

In an embodiment, the OMN and filter 506 is implemented using integrated passive device (IPD) technology. IPD technology enables passive devices, such as capacitors, resistors, and high-Q inductors to be implemented in silicon, for example. IPDs are generally fabricated using standard wafer fabrication technologies such as thin film and photolithography processing. IPDs can be designed as flip chip mountable or wire bondable components and the substrates for IPDs are, for example, silicon, alumina, and glass. IPD components are less lossy than the passive components integrated onto the power amplifier and OMN IC 202.

In another embodiment, the concurrent OMN and filter 506 is implemented using ceramic components, such as LTCC components. In a further embodiment, the concurrent OMN and filter 506 is implemented as an external discrete filter using passive components, such as external inductors and capacitors. In another embodiment, the concurrent OMN and filter 506 is implemented using surface mount devices, such as surface mounted inductors and capacitors.

The input tuning circuit 504 comprises a matching component at an input to the concurrent OMN and filter 506 and the output tuning circuit 508 comprises a matching component at an output of the concurrent OMN and filter 506 to further tune the concurrent OMN and filter 506. In an embodiment, each tuning circuit 504, 508 comprises a single passive component to permit greater flexibility in the circuit design.

For example, the input and output tuning circuits 504, 508 are used to tune the board to account for printed circuit board (PCB) parasitics, which may affect the impedance of the transmission line from the power amplifier 514 to the switch/LNA circuit 210. In other words, since the impedance at the output of the power amplifier 514 is approximately 6 ohms, the impedance of the transmission line that electrically connects the output of the power amplifier 514 to the concurrent OMN and filter 506 should also be approximately 6 ohms. The input tuning circuit 504 can be used to tune the impedance of the 6 ohm transmission line. Likewise, since the impedance at the input to the switch/LNA circuit 210 is approximately 50 ohms, the impedance of the transmission line that electrically connects the output of the concurrent OMN and filter 506 should be approximately 50 ohms. If, for example, the impedance at the input to the switch/LNA circuit 210 is not exactly 50 ohms, the output tuning circuit 508 can be used to tune the 50 ohm transmission line.

Using the input and output tuning circuits 504, 508 in the transmit path 500 reduces the external component count over that of the transmit path 200 comprising the input and output tuning circuits 504, 508. In another embodiment, the input and output tuning circuits 504, 508 may be eliminated from the transmit path 500, further reducing the external component count.

As described above, the switch/LNA circuit 210 has an input impedance of approximately 50 ohms and comprises the switch 220 configured to switch between transmit and receive modes and the low noise amplifier (LNA) 218. When the switch 220 is configured in the receive mode, signals received at the antenna 212 are passed through the LNA 218 and onto a receive path. When the switch 220 is configured in the transmit mode, the RF transmit signal in the transmit path 500, having been amplified, filtered, and tuned, is passed to the antenna 212 for transmission.

Figure 6A:
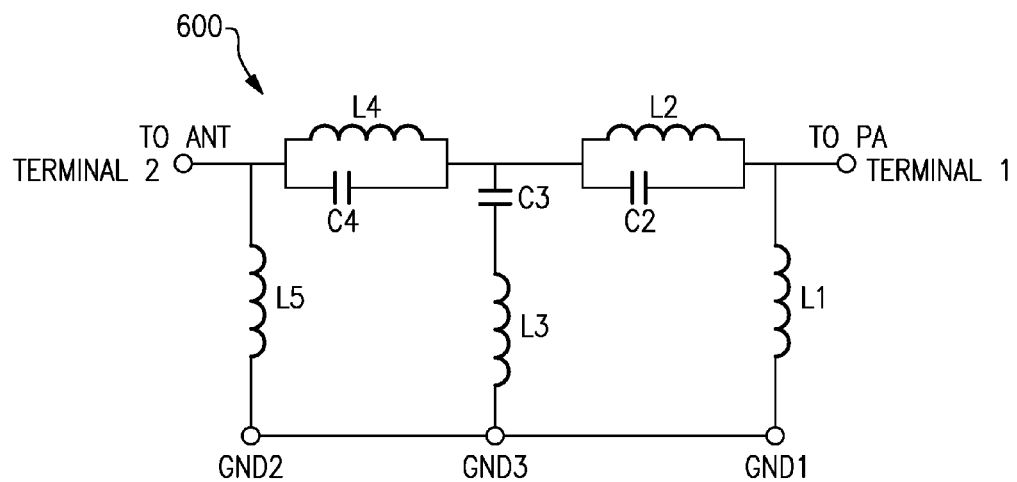
FIGS. 6A and 6B are exemplary schematic diagrams of a combined output-matching network and filter with concurrent functionality, according to certain embodiments.

FIG. 6A is an exemplary circuit 600 of a combined output matching network and filter with concurrent functionality comprising inductors L1, L2, L3, L4, L5 and capacitors C2, C3, C4. A first terminal TERMINAL1 of the circuit 600 electrically couples to an output of the power amplifier IC 502 through the input tuning circuit 504.

The first terminal TERMINAL1 of the circuit 600 further couples to a first end of inductor L2, a first end of capacitor C2, and a first end of inductor L1. Inductor L2 and capacitor C2 are connected in parallel. A second end of inductor L2 and a second end of capacitor C2 electrically couple to a first end of capacitor C3, a first end of capacitor C4, and a first end of inductor L4. A second end of capacitor C3 electrically couples to a first end of inductor L3. Capacitor C4 and inductor L4 are connected in parallel. A second end of capacitor C4, a second end of inductor L4 and a first end of inductor L5 electrically couple to a second terminal TERMINAL2 of the circuit 600. A second end of inductor L1, a second end of inductor L3, and a second end of inductor L5 electrically couple to ground GND.

The second terminal TERMINAL2 of the circuit 600 further electrically couples to an input of the switch/LNA circuit 210 through the output tuning circuit 508.

The circuit 600 is configured to filter out blocking signals that are traveling from the antenna 212 toward the power amplifier 502 when the switch/LNA circuit 210 is in the transmit mode. Concurrently or at the same time, the circuit 600 is configured to transform the power amplifier output impedance to the input impedance of the antenna 212 to optimize the power of the transmit signal transferred to the antenna 212. In an embodiment, the circuit 600 transforms an approximately 6 ohm power amplifier output impedance to an approximately 50 ohms antenna input impedance. In another embodiment, the circuit 600 is further configured to filter $n^{th}$ order harmonics, such as, for example, $2^{nd}$, $3^{rd}$ and/or $4^{th}$ order harmonics of the RF transmit signal generated by the power amplifier 514. In the embodiment of the concurrent OMN and filter 600 illustrated in FIG. 6A, the components L1-L2 and C2-C4 perform the blocking, impedance matching, and harmonic filtering functions simultaneously or approximately simultaneously.

In an embodiment, L1, L5 perform impedance transforming in the main frequency band. L2/C2, L3/C3, and L4/C4 also perform impedance transforming in the main frequency band and filter/block harmonics generated by power amplifier 514 or interfering signals entering the transmit path through the antenna 212 in other frequency bands. In other embodiments, L1, L5 can be transformed to suitable topologies to perform additional filtering functions.

Figure 7:
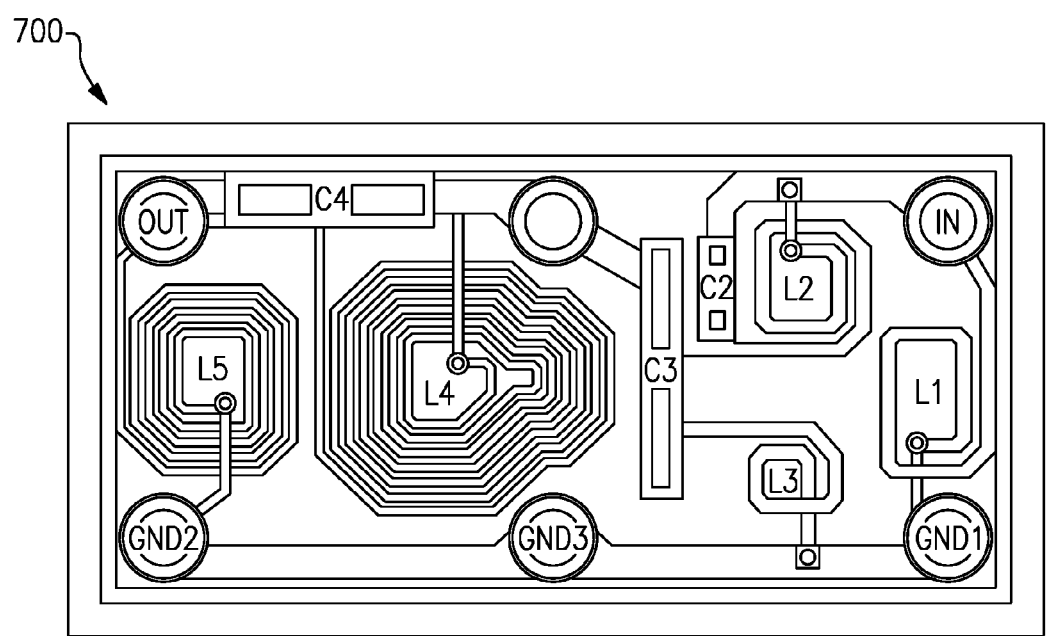
FIG. 7 is an exemplary layout of the circuit of FIG. 6A, according to certain embodiments.

FIG. 7 is an exemplary layout 700 of the circuit 600.

Figure 6B:
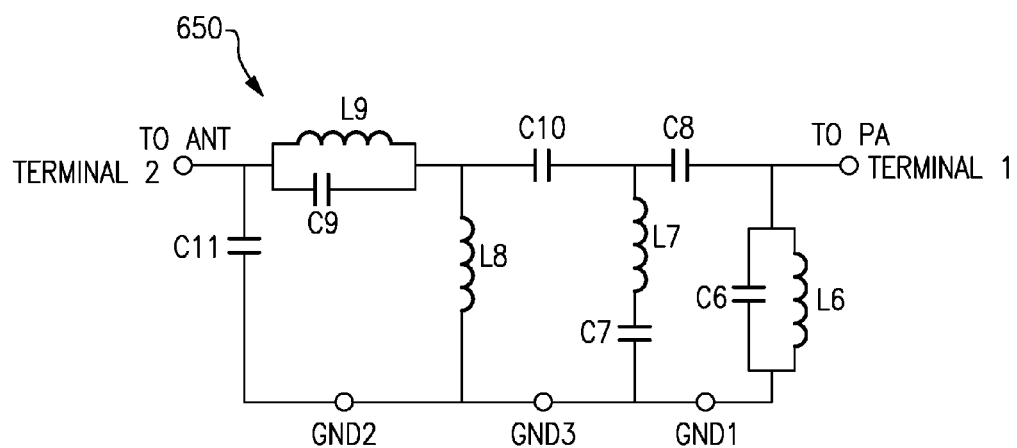

FIG. 6B is an exemplary circuit 650 of another embodiment of a combined output matching network and filter with concurrent functionality comprising inductors L6, L7, L8, L9 and capacitors C6, C7, C8, C9, C10, C11. A first terminal TERMINAL1 of the circuit 650 electrically couples to an output of the power amplifier IC 502 through the input tuning circuit 504.

The first terminal TERMINAL1 of the circuit 650 further couples to a first end of inductor L6, a first end of capacitor C6, and a first end of capacitor C8. Inductor L6 and capacitor C6 are connected in parallel. A second end of inductor L6 and a second end of capacitor C6 electrically couple to ground GND. A second end of capacitor C8 electrically couples to a first end of capacitor C10 and a first end of inductor L7. A second end of inductor L7 electrically couples to a first end of capacitor C7 and a second end of capacitor C7 electrically couples to ground GND. A second end of capacitor C10 electrically couples to a first end of inductor L8, a first end of indictor L9 and a first end of capacitor C9. Capacitor C9 and inductor L9 are connected in parallel. A second end of capacitor C9, a second end of inductor L9, and a first end of capacitor C11 electrically couple to a second terminal TERMINAL2 of the circuit 650. A second end of inductor L8 and a second end of capacitor C11 electrically couple to ground GND.

The second terminal TERMINAL2 of the circuit 650 further electrically couples to an input of the switch/LNA circuit 210 through the output tuning circuit 508.

The circuit 650 is configured to filter out blocking signals that are traveling from the antenna 212 toward the power amplifier 502 when the switch/LNA circuit 210 is in the transmit mode. Concurrently or at the same time, the circuit 650 is configured to transform the power amplifier output impedance to the input impedance of the antenna 212 to optimize the power of the transmit signal transferred to the antenna 212. In an embodiment, the circuit 650 transforms an approximately 6 ohm power amplifier output impedance to an approximately 50 ohms antenna input impedance. In another embodiment, the circuit 650 is further configured to filter $n^{th}$ order harmonics, such as, for example, $2^{nd}$, $3^{rd}$ and/or $4^{th}$ order harmonics of the RF transmit signal generated by the power amplifier 514. In the embodiment of the concurrent OMN and filter 650 illustrated in FIG. 6B, the components L6-L9 and C6-C11 perform the blocking, impedance matching, and harmonic filtering functions simultaneously or approximately simultaneously.

Figure 5B:
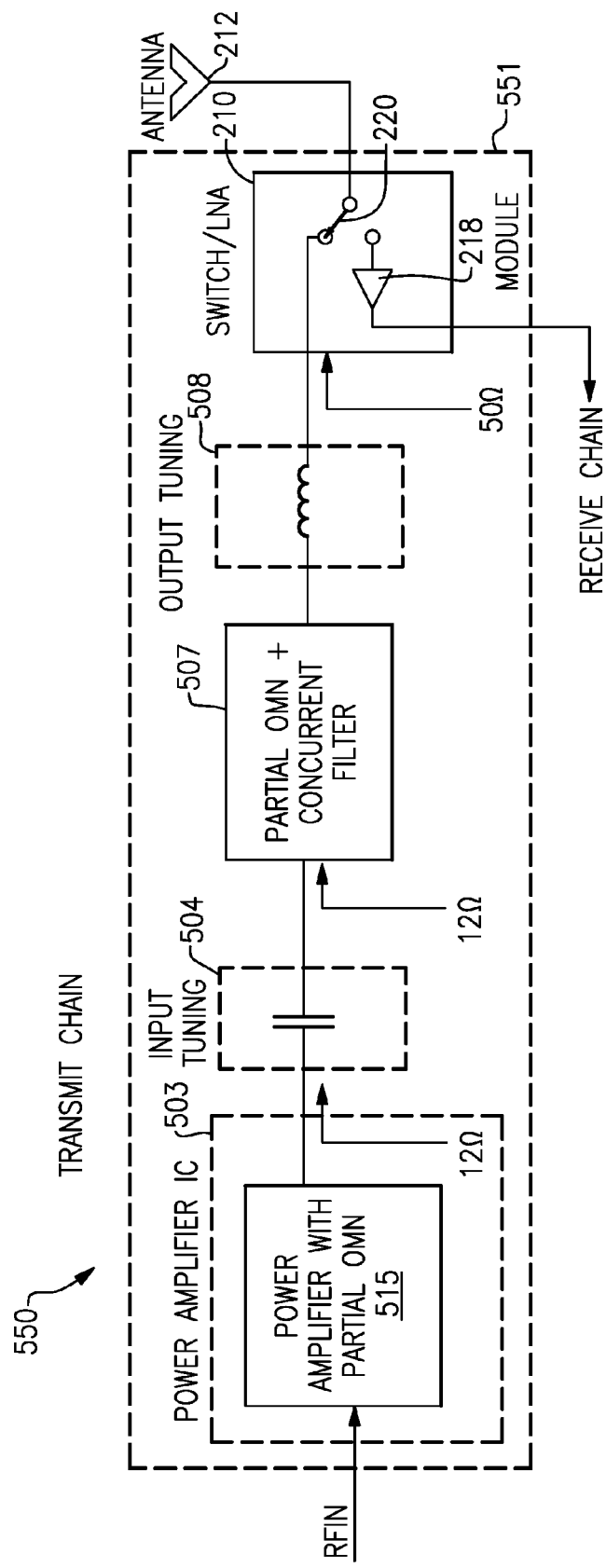

FIG. 5B is an exemplary block diagram of an RF transmit path 550 comprising a power amplifier IC 503, the input tuning circuit 504, a filter 507, the output tuning circuit 508, the switch/LNA circuit 210, and the antenna 212. The power amplifier IC 503 comprises a power amplifier and partial output matching network circuit 515. The power amplifier portion of the circuit 515 comprises one or more amplifier stages and is configured to amplify the RF transmit signal. The partial output matching network portion of the circuit 515 comprises an impedance matching circuit configured to transform an impedance of a circuit, such as the power amplifier, from approximately 6 ohms to approximately 12 ohms.

In an embodiment, a module 551, such as a front end module, comprises the power amplifier IC 503, the input tuning circuit 504, the filter 507, the output tuning circuit 508, and the switch/LNA circuit 210. In another embodiment, the module 551 comprises the power amplifier IC 503, the input tuning circuit 504, the filter 507, and the output tuning circuit 508. In a further embodiment, the module 551 comprises the power amplifier IC 503, the input tuning circuit 504, and the filter 507. In a further embodiment, the module 551 comprises the power amplifier IC 503 and the filter 507.

As described above, the amplifier IC 503 comprises an amplifier as well as an impedance matching circuit that is configured to transform an impedance of approximately 6 ohms to an impedance of approximately 12 ohms. The filter 507 receives the signal having the impedance of approximately 12 ohms from the power amplifier IC 503 and is configured to transform the approximately 12 ohm impedance to approximately 50 ohms and to concurrently block signals received from an external antenna from traveling from the antenna 212 to the power amplifier circuit 515 along the RF transmit path 550.

An input to the power amplifier IC 503 receives an RF transmit signal from an RF transmitter. An output of the power amplifier IC 503 electrically couples to an input of the filter 507 through the input tuning circuit 504. An output of the filter 507 electrically couples to an input of the switch/LNA 210. When the switch 220 is in the transmit mode, an output of the switch/LNA 210 electrically couples to the antenna 212 such that the amplified, impedance matched, and filtered RF transmit signal is transmitted by the antenna 212.

The power amplifier integrated circuit (IC) 503 comprises the power amplifier and partial output matching network circuit 515 integrated onto a power amplifier die. The power amplifier 515 is implemented on a lossy integrated circuit substrate, such as SiGe, CMOS, GaAs, SiC, or other semiconducting materials, for example. In contrast to the power amplifier IC 202, a portion of the OMN is moved off the power amplifier die and implemented into the filter 507. In contrast to the concurrent OMN and filter 506, a portion of the OMN is moved onto the power amplifier die 503 and the remaining portion of the OMN is implemented into the filter 507.

In an embodiment, the power amplifier and partial OMN circuit 515 is configured to implement amplifying and 6 ohm to 12 ohm impedance matching. In other embodiments, the power amplifier and partial OMN circuit 507 implements amplifying and impedance matching between source and load impedances that are less than approximately 6 ohms, greater than approximately 6 ohms, less than approximately 12 ohms or greater than approximately 12 ohms.

The filter 507 is referred to as a partial concurrent OMN and filter and comprises a combined matching network and filter with concurrent functionality. The partial OMN and filter 507, like the concurrent OMN and filter 506, is configured to implement impedance matching and filtering concurrently.

In an embodiment, the power amplifier and partial OMN circuit 515 is configured to step up an output impedance of the power amplifier circuit from an initial value to a stepped-up value that is preferably between approximately 10% and 50% of the input impedance of the downstream component. In other embodiments, the stepped-up value is between 5% and 95%, 10% and 80%, 15% and 75%, 20% and 60%, 30% and 40% and the like, of the input impedance of the downstream component. In other embodiments, other ranges for the stepped-up value can be used. In an embodiment, the partial concurrent OMN and filter 507 is configured to step-up the output impedance of the power amplifier and partial OMN circuit 515 to the impedance of the downstream component. In an embodiment, the downstream component is an antenna.

It should be noted that the partial concurrent OMN and filter 507 is not a series OMN followed by a filter. The filter and OMN are combined such that components are functioning as matching components and filtering components concurrently. Since the filter is part of the OMN and vice versa, the overall signal losses are less than the losses incurred when the OMN and filter are implemented separately. Further, the size of the partial concurrent OMN and filter 507 is less than the combined size of the OMN and filter implemented separately.

In an embodiment, the partial concurrent OMN and filter 507 is implemented using integrated passive device (IPD) technology. In another embodiment, the partial concurrent OMN and filter 507 is implemented using ceramic components, such as LTCC components. In a further embodiment, the partial concurrent OMN and filter 507 is implemented as an external discrete filter using passive components, such as external inductors and capacitors. In another embodiment, the partial concurrent OMN and filter 507 is implemented using surface mount devices, such as surface mounted inductors and capacitors.

The input tuning circuit 504 comprises a matching component at an input to the partial concurrent OMN and filter 507 and the output tuning circuit 508 comprises a matching component at an output of the partial concurrent OMN and filter 507 to further tune the partial concurrent OMN and filter 507. In an embodiment, each tuning circuit 504, 508 comprises a single passive component to permit greater flexibility in the circuit design, as described above.

Figure 6C:
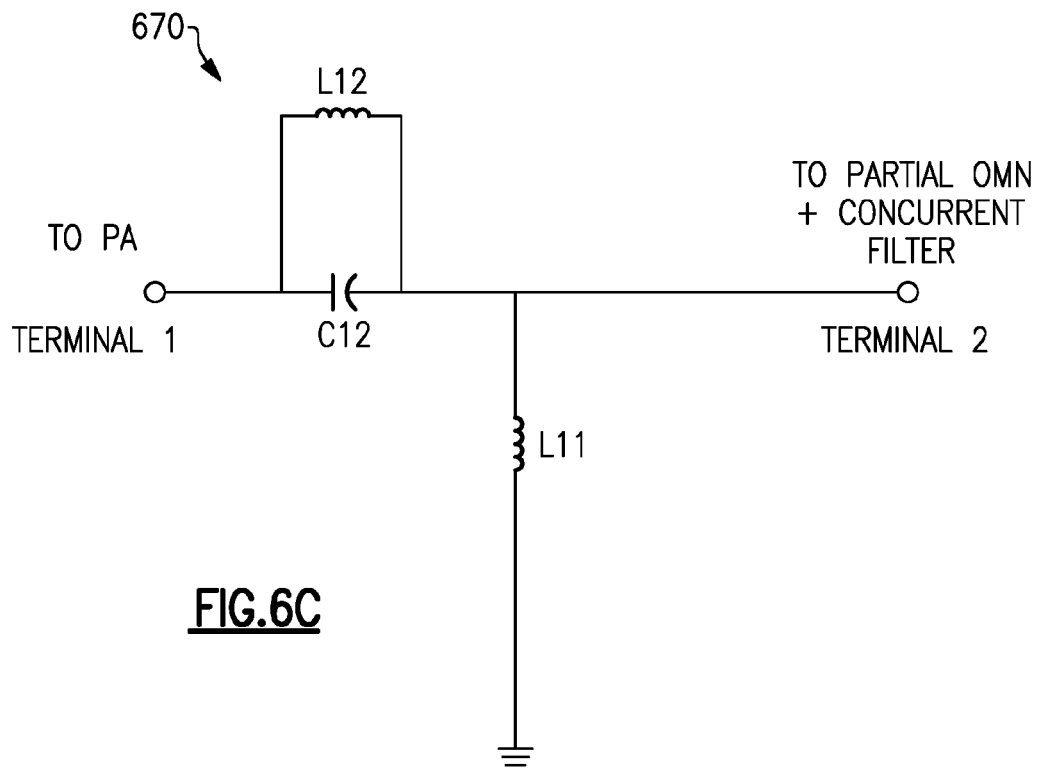
FIG. 6C is an exemplary schematic diagram of a partial output-matching network for implementation on a power amplifier die, according to certain embodiments.

FIG. 6C is an exemplary circuit 670 of a partial output matching network for implementation on the power amplifier die 503. Circuit 670 comprises inductors L11, L12, and capacitor C12. A first terminal TERMINAL1 of the circuit 670 electrically couples to an output of the power amplifier on the power amplifier IC 503.

The first terminal TERMINAL1 of the circuit 670 further couples to a first end of inductor L12 and a first end of capacitor C12. Inductor L12 and capacitor C12 are connected in parallel. A second end of inductor L12 and a second end of capacitor C12 electrically couple to a first end of inductor L11 and a second terminal TERMINAL2 of the circuit 670. A second end of inductor L11 electrically couples to ground GND.

The second terminal TERMINAL2 of the circuit 670 further electrically couples to an input of the partial OMN and concurrent filter 507. In an embodiment, the second terminal TERMINAL2 of the circuit 670 electrically couples to the input of the partial OMN and concurrent filter 507 through the input tuning circuit 504.

The circuit 670 is configured to transform the power amplifier output impedance to the input impedance of the partial OMN and concurrent filter 507. In an embodiment, the circuit 670 transforms an approximately 6 ohm power amplifier output impedance to an approximately 12 ohm impedance.

Figure 6D:
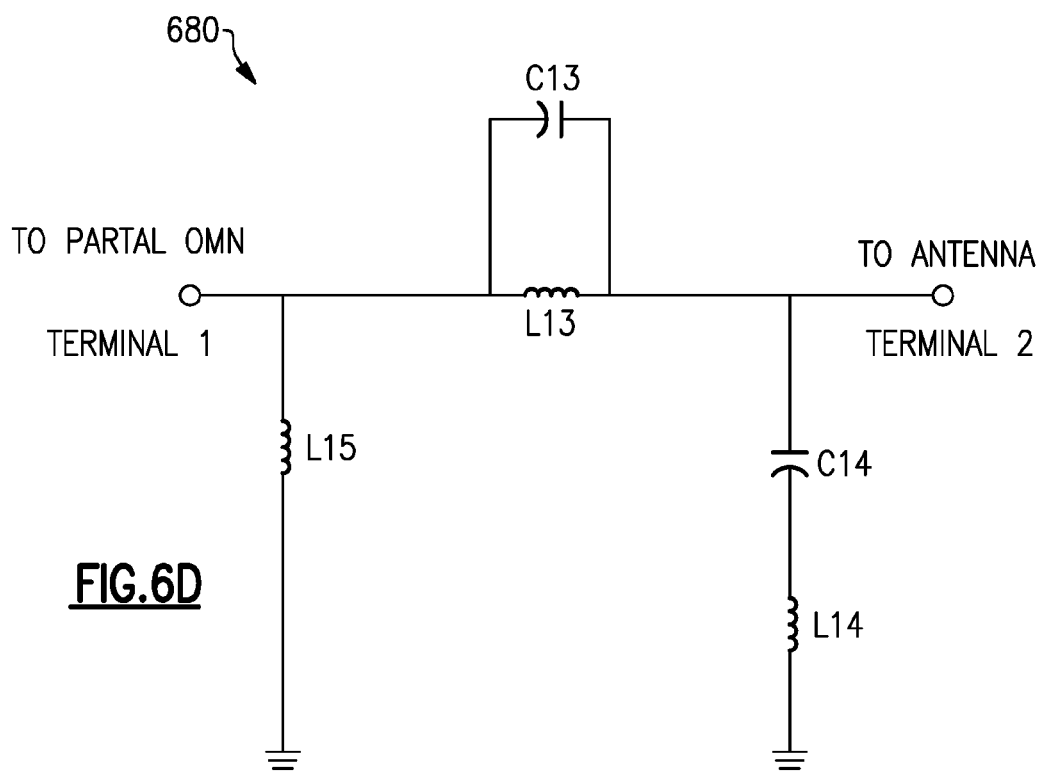
FIG. 6D is an exemplary schematic diagram of a partial output-matching network and filter with concurrent functionality for implementation off of a power amplifier die, according to certain embodiments.

FIG. 6D is an exemplary circuit 680 of a partial output matching network and filter with concurrent functionality for implementation off of the power amplifier die 503. Circuit 670 comprises inductors L13, L14, L15 and capacitors C13, C14. A first terminal TERMINAL1 of the circuit 680 electrically couples to an output of the partial OMN on the power amplifier IC 503. In an embodiment, the first terminal TERMINAL1 of the circuit 680 electrically couples to the second terminal TERMINAL2 of the circuit 670 through the input tuning circuit 504.

The first terminal TERMINAL1 of the circuit 680 further electrically couples to a first terminal of capacitor 13, a first terminal of inductor L13, and a first terminal of inductor L15. Capacitor C13 and inductor L13 are configured in parallel. A second end of capacitor C13 and a second end of inductor L13 electrically couple to a first end of capacitor C14 and a second terminal TERMINAL2 of the circuit 680. A second end of capacitor C14 electrically couples to a first end of inductor L14. A second end of inductor L15 and a second end of inductor L15 electrically couple to ground GND.

The second terminal TERMINAL2 of the circuit 680 further electrically couples to an input of the switch/LNA circuit 210 through the output tuning circuit 508.

The circuit 680 is configured to filter out blocking signals that are traveling from the antenna 212 toward the power amplifier 503 when the switch/LNA circuit 210 is in the transmit mode. Concurrently or at the same time, the circuit 680 is configured to transform the output impedance of the power amplifier IC 503 to the input impedance of the antenna 212 to optimize the power of the transmit signal transferred to the antenna 212. In an embodiment, the circuit 680 transforms an approximately 12 ohm output impedance of the power amplifier IC 503 to an approximately 50 ohms antenna input impedance. In another embodiment, the circuit 680 is further configured to filter $n^{th}$ order harmonics, such as, for example, $2^{nd}$, $3^{rd}$ and/or $4^{th}$ order harmonics of the RF transmit signal generated by the power amplifier 503. In the embodiment of the partial concurrent OMN and filter 680 illustrated in FIG. 6D, the components L13, L14, L15, C13, and C14 perform the blocking, impedance matching, and harmonic filtering functions simultaneously or approximately simultaneously.

In an embodiment, the partial concurrent OMN and filter with concurrent functionality 507, 680 is implemented as an IPD and the partial OMN 670 is implemented on the silicon die 503 with the power amplifier. The quality factor Q of inductors L13, L14, L15 on the IPD are much higher than on the silicon die 503. In a further embodiment, the larger inductors are preferably implemented on the IPD instead of the silicon die 503.

Figure 5C:
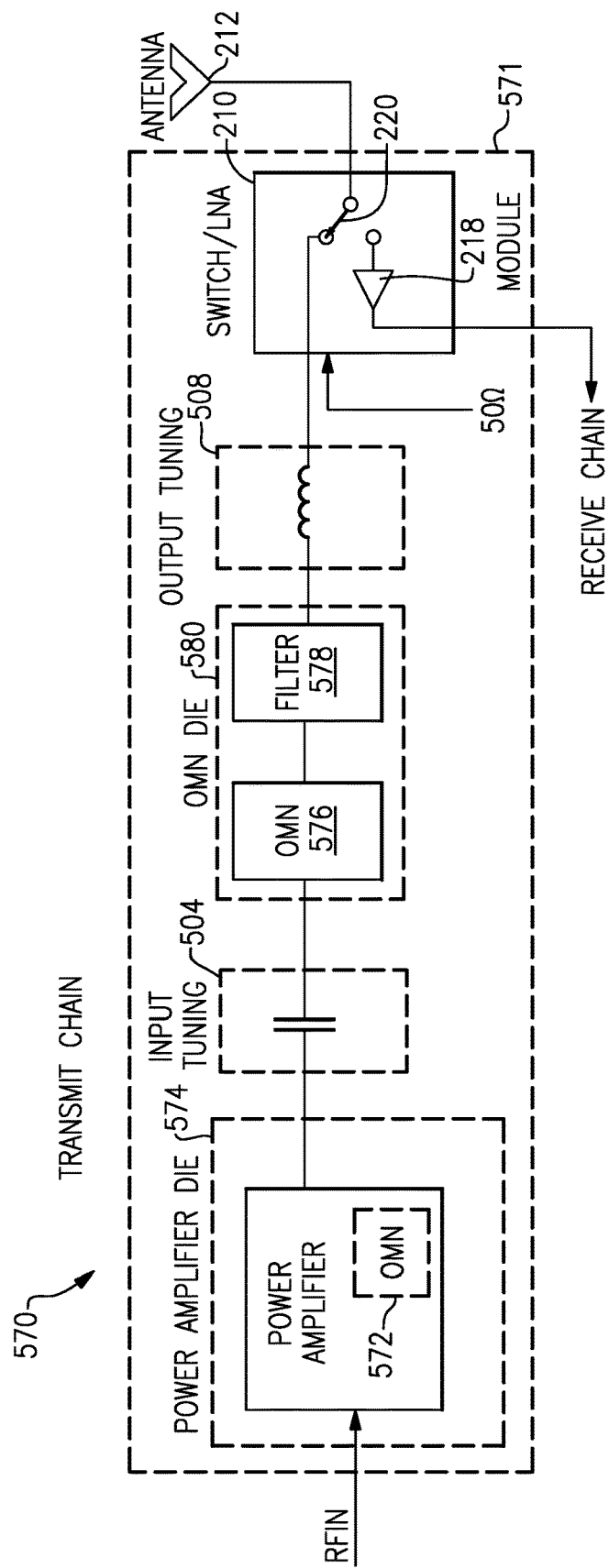
FIG. 5C is an exemplary block diagram of an RF transmit path including an embodiment of a output-matching network and filter located off of a power amplifier die, according to certain embodiments.

FIG. 5C is an exemplary block diagram of an RF transmit path 570 including comprising a power amplifier IC 574, the input tuning circuit 504, an OMN 576, a filter 580, the output tuning circuit 508, the switch/LNA circuit 210 and the antenna 212. The power amplifier 574 comprises one or more amplifier stages and is configured to amplify the RF transmit signal.

In an embodiment, a module 571, such as a front end module, comprises the power amplifier IC 574, the input tuning circuit 504, the OMN 576, the filter 578, the output tuning circuit 508, and the switch/LNA circuit 210. In another embodiment, the module 571 comprises the power amplifier IC 574, the input tuning circuit 504, the OMN 576, the filter 578, and the output tuning circuit 508. In a further embodiment, the module 571 comprises the power amplifier IC 574, the input tuning circuit 504, the OMN 576, and the filter 578. In a further embodiment, the module 501 comprises the power amplifier IC 574, the OMN 576, the filter 578.

The OMN 576 is configured to transform the impedance of the RF transmit path 570 from the power amplifier 514 to the antenna 212. The OMN 576 transforms the approximately 6 ohm output impedance of the power amplifier to the approximately 50 ohm input impedance of the antenna 212. The filter 578 is configured to block signals received from an external antenna from traveling from the antenna 212 to the power amplifier 574 along the RF transmit path 570. The OMN 576 and the filter 580 are located off of the power amplifier die 574. The OMN 576 and the filter 580 can be implemented as an IPD, as discrete components, as surface mount components, and the like.

In another embodiment, the power amplifier IC further comprises a first partial OMN 572, such as circuit 670, and the OMN 576 comprises a second partial OMN, such as circuit 680, and the combined functionality of the first and second partial OMNs transforms the approximately 6 ohm output impedance of the power amplifier to the approximately 50 ohm input impedance of the antenna 212.

Figure 8:
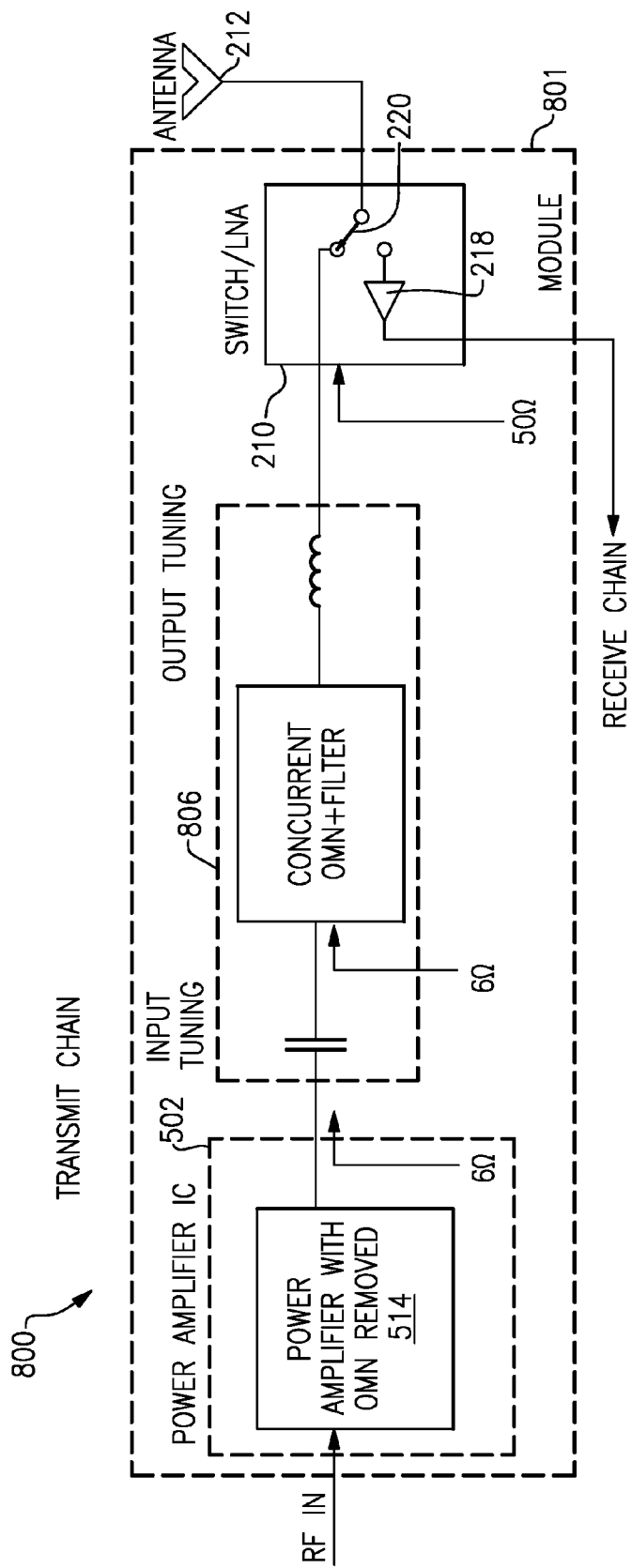
FIG. 8 is an exemplary block diagram of an RF transmit path including another embodiment of a combined output-matching network and filter with concurrent functionality, according to certain embodiments.

FIG. 8 is an exemplary block diagram of an RF transmit path 800 including another embodiment of a concurrent OMN and filter 806. The concurrent OMN and filter 806 is configured to combine the output matching network and filter with concurrent functionality and is further configured to comprise the input tuning and output tuning components.

In an embodiment, a module 801, such as a front end module, comprises the power amplifier IC 502, the concurrent OMN and filter 806, and the switch/LNA circuit 210. In another embodiment, the module 501 comprises the power amplifier IC 502 and the concurrent OMN and filter 806.

In another embodiment, the concurrent OMN and filter 502, 600, 650, 806 further comprises an input matching network (IMN) associated with the receive path of the device 100. In a further embodiment, a combination input IMN and filter can be used in the receive path. For example, LNA's often use matching at the input to achieve the lowest possible noise figure. The combination IMN and filter comprising an IPD that concurrently functions as an IMN and as a filter can be used to match the input impedance of the LNA and filter the receive signal.

While the concurrent OMN and filter 506, 600, 650, 806 has been discussed herein with respect to concurrently performing impedance transformation and blocking tones from mixing with the amplified output of the power amplifier 514, other embodiments of the concurrent OMN and filter 506, 600, 650, 806 perform concurrent impedance matching and filtering or signal conditioning. In an embodiment, the concurrent OMN and filter 506, 600, 650, 806 performs bi-directional concurrent impedance matching and signal conditioning. In further embodiments, the concurrent OMN and filter 506, 600, 650, 806 can be configured to combine output matching functionality and any type of signal conditioning. Other embodiments of the concurrent OMN and filter 506, 600, 650, 806 to affect a combined output matching network and filter with concurrent functionality may be configured differently and with different passive components as is known to one of skill in the art from the disclosure herein.

The concurrent OMN and filter 506, 600 650 reduces power loss and uses less space when compared to other configurations of the transmit path. For comparison purposes, −30 dB EVM power was simulated for three configurations. For a transmit path implemented with the power amplifier IC including an on-die OMN, and an external LTCC filter, the −30 dB EVM power was approximately 19.3 dBm; for a transmit path implemented with a power amplifier IC excluding the OMN, an off-die discrete OMN, and an external LTCC filter, the −30 dB EVM power was approximately 19.3 dBm; and for a transmit path implemented with a power amplifier IC excluding the OMN, and the concurrent OMN and filter 506, 600, 806, the −30 dB EVM power was approximately 21.3 dBM. Use of the concurrent OMN and filter 506, 600, 650 results in at least 2 dB improvement.

The size implications are also advantageous. For comparison purposes, the printed circuit board area was determined for two functionally comparable configurations. The board area for the power amplifier IC including an on-die OMN, four matching components, and an external LTCC filter is approximately 3 mm$^2$, while the board area of the power amplifier IC excluding the OMN, and the concurrent OMN and filter 506, 600, 650 is approximately 2.4 mm$^2$. Use of the concurrent OMN and filter 506, 600, 650 results in approximately a 20% reduction in board space.

Figure 9:
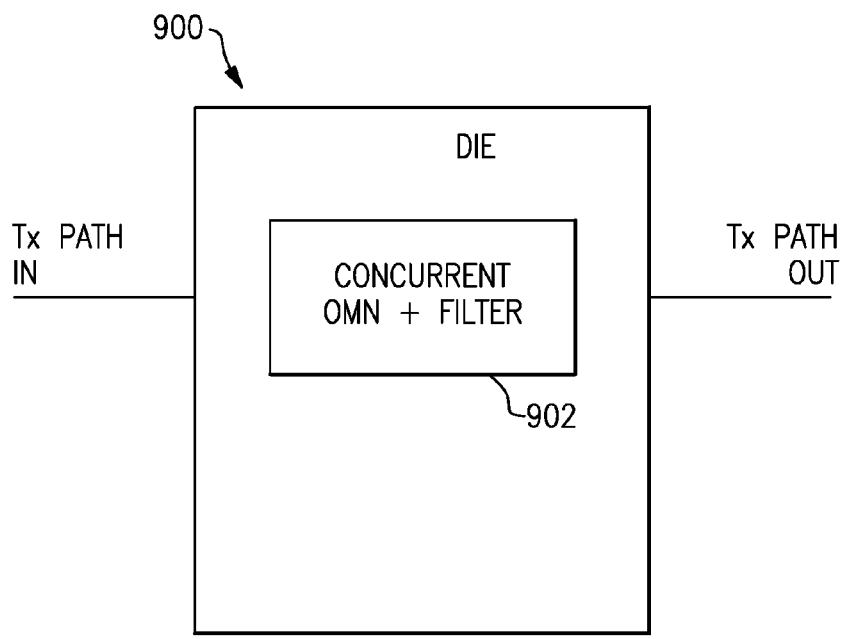
FIG. 9 is an exemplary block diagram of a concurrent output matching network and filter semiconductor die including an embodiment of a concurrent output matching network and filter circuit, according to certain embodiments.

FIG. 9 is an exemplary block diagram of a concurrent output matching network and filter semiconductor die 900 including an embodiment of a concurrent output matching network and filter circuit 902. In an embodiment, the circuit 902 comprises the concurrent output matching network and filter 506. In another embodiment, the circuit 902 comprises the concurrent output matching network and filter 806 that further includes the functionality of input tuning and output tuning. In another embodiment, the circuit 902 comprises the concurrent output matching network and filter circuit 600, 650. In a further embodiment, the circuit 902 comprises the partial concurrent OMN and filter 507.

In an embodiment, the die 900 comprises a silicon (Si) die. In an embodiment, the Si die comprises a Si CMOS die, a SiGe BiCMOS die, and the like. In another embodiment, the die 900 can comprise a gallium arsenide (GaAs) die, a pseudomorphic high electron mobility transistor (pHEMT) die, or the like. In an embodiment, the die 900 implements IPD technology for the components of the concurrent OMN and filter circuits 506, 600, 650, 806.

Figure 10:
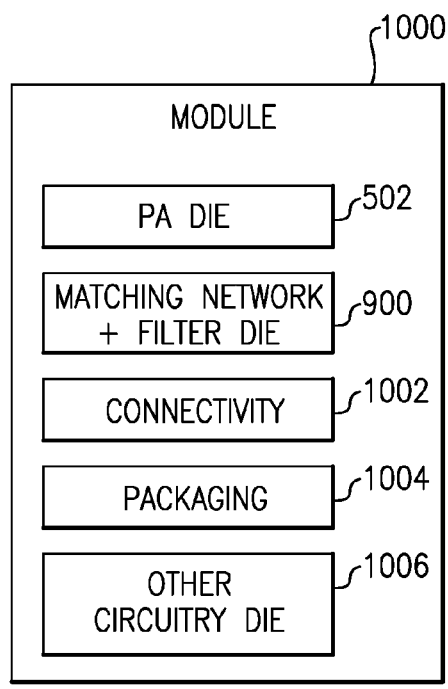
FIG. 10 is an exemplary block diagram of a multimode signal processing module including the concurrent output matching network and filter semiconductor die of FIG. 9, according to certain embodiments.

FIG. 10 is an exemplary block diagram of a module including the concurrent output matching network and filter semiconductor die 900 of FIG. 9 and the power amplifier integrated circuit 502, 503, or 574. The module 1000 further includes connectivity 1002 to provide signal interconnections, packaging 1004, such as for example, a package substrate, for packaging of the circuitry, and other circuitry die 1006, such as, for example amplifiers, pre-filters, post filters modulators, demodulators, down converters, and the like, as would be known to one of skill in the art of semiconductor fabrication in view of the disclosure herein. In an embodiment, the module 1000 comprises a front end module. In an embodiment, the module 1000 further comprises the switch/LNA circuit 210.

Figure 11:
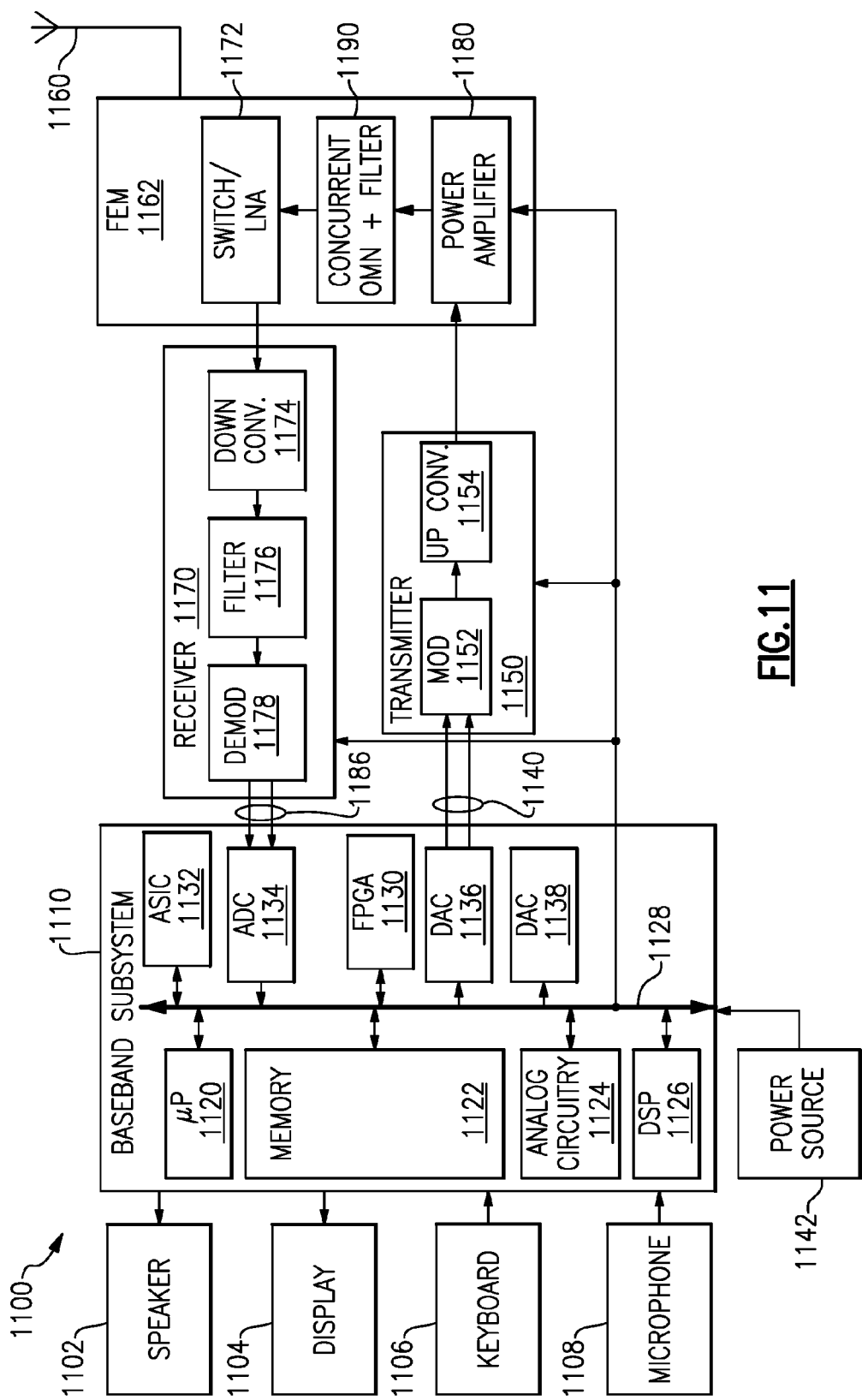
FIG. 11 is an exemplary block diagram illustrating a simplified portable transceiver including an embodiment of a combined output matching network and filter with concurrent functionality, according to certain embodiments.

FIG. 11 is an exemplary block diagram illustrating a simplified portable transceiver 1100 including an embodiment of the combined output matching network and filter with concurrent functionality 506, 507, 600, 650, 700, or 806 or an embodiment of the OMN 576 and filter 578.

The portable transceiver 1100 includes a speaker 1102, a display 1104, a keyboard 1106, and a microphone 1108, all connected to a baseband subsystem 1110. A power source 1142, which may be a direct current (DC) battery or other power source, is also connected to the baseband subsystem 1110 to provide power to the portable transceiver 1100. In a particular embodiment, portable transceiver 1100 can be, for example but not limited to, a portable telecommunication device such as a mobile cellular-type telephone. The speaker 1102 and the display 1104 receive signals from baseband subsystem 1110, as known to those skilled in the art. Similarly, the keyboard 1106 and the microphone 1108 supply signals to the baseband subsystem 1110.

The baseband subsystem 1110 includes a microprocessor (μP) 1120, memory 1122, analog circuitry 1124, and a digital signal processor (DSP) 1126 in communication via bus 1128. Bus 1128, although shown as a single bus, may be implemented using multiple busses connected as necessary among the subsystems within the baseband subsystem 1110. The baseband subsystem 1110 may also include one or more of an application specific integrated circuit (ASIC) 1132 and a field programmable gate array (FPGA) 1130.

The microprocessor 1120 and memory 1122 provide the signal timing, processing, and storage functions for portable transceiver 1100. The analog circuitry 1124 provides the analog processing functions for the signals within baseband subsystem 1110. The baseband subsystem 1110 provides control signals to a transmitter 1150, a receiver 1170, and a power amplifier 1180, for example.

It should be noted that, for simplicity, only the basic components of the portable transceiver 1100 are illustrated herein. The control signals provided by the baseband subsystem 1110 control the various components within the portable transceiver 1100. Further, the function of the transmitter 1150 and the receiver 1170 may be integrated into a transceiver.

The baseband subsystem 1110 also includes an analog-to-digital converter (ADC) 1134 and digital-to-analog converters (DACs) 1136 and 1138. In this example, the DAC 1136 generates in-phase (I) and quadrature-phase (Q) signals 1140 that are applied to a modulator 1152. The ADC 1134, the DAC 1136 and the DAC 1138 also communicate with the microprocessor 1120, the memory 1122, the analog circuitry 1124 and the DSP 1126 via bus 1128. The DAC 1136 converts the digital communication information within baseband subsystem 1110 into an analog signal for transmission to the modulator 1152 via connection 1140. Connection 1140, while shown as two directed arrows, includes the information that is to be transmitted by the transmitter 1150 after conversion from the digital domain to the analog domain.

The transmitter 1150 includes the modulator 1152, which modulates the analog information on connection 1140 and provides a modulated signal to upconverter 1154. The upconverter 1154 transforms the modulated signal to an appropriate transmit frequency and provides the upconverted signal to the power amplifier 1180. The power amplifier 1180 amplifies the signal to an appropriate power level for the system in which the portable transceiver 1100 is designed to operate.

Details of the modulator 1152 and the upconverter 1154 have been omitted, as they will be understood by those skilled in the art. For example, the data on connection 1140 is generally formatted by the baseband subsystem 1110 into in-phase (I) and quadrature (Q) components. The I and Q components may take different forms and be formatted differently depending upon the communication standard being employed.

A front end module 1162 comprises the power amplifier circuit 1180 and a switch/low noise amplifier circuit 1172. In an embodiment, the switch/low noise amplifier circuit 1172 comprises an antenna system interface that may include, for example, a diplexer having a filter pair that allows simultaneous passage of both transmit signals and receive signals, as known to those having ordinary skill in the art.

In an embodiment, the front end module further comprises a combined output matching network and filter with concurrent functionality 1190, which includes an embodiment of the concurrent output matching network and filter circuit 506, 507, 600, 650, 700, 806, or the OMN 574 and filter 576. The power amplifier 1180 supplies the amplified transmit signal to the combined output matching network and filter with concurrent functionality 1190, which filters the signal and matches or approximately matches the impedance to the impedance of the antenna 1160. In addition, the combined output matching network and filter with concurrent functionality 1190 blocks signals received by the antenna 1160 from external antennas when the switch is in the transmit mode. The transmit signal is supplied from the front end module 1162 to the antenna 1160 when the switch is in the transmit mode.

In an embodiment, the front end module 1162 comprises the module 1000 including the matching network and filter die 900. In an embodiment, the combined output matching network and filter with concurrent functionality 1190 comprises the module 1000 including the matching network and filter die 900.

A signal received by antenna 1160 will be directed from the switch/low noise amplifier 1172 of the front end module 1162 to the receiver 1170 when the switch is in the receive mode. The low noise amplifier circuitry 1172 amplifies the received signal.

If implemented using a direct conversion receiver (DCR), the downconverter 1174 converts the amplified received signal from an RF level to a baseband level (DC), or a near-baseband level (approximately 100 kHz). Alternatively, the amplified received RF signal may be downconverted to an intermediate frequency (IF) signal, depending on the application. The downconverted signal is sent to the filter 1176. The filter 1176 comprises a least one filter stage to filter the received downconverted signal as known in the art.

The filtered signal is sent from the filter 1176 to the demodulator 1178. The demodulator 1178 recovers the transmitted analog information and supplies a signal representing this information via connection 1186 to the ADC 1134. The ADC 1134 converts these analog signals to a digital signal at baseband frequency and transfers the signal via bus 1128 to the DSP 1126 for further processing.

Terminology

Some of the embodiments described above have provided examples in connection with mobile phones. However, the principles and advantages of the embodiments can be used for any other systems or apparatus that have needs for power amplifier systems.

Such a system or apparatus can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone such as a smart phone, a telephone, a television, a computer monitor, a computer, a hand-held computer, a laptop computer, a tablet computer, a personal digital assistant (PDA), a PC card, a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods, apparatus, and systems described herein may be embodied in a variety of other forms; furthermore, various omissions, substitutions, and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio frequency power amplifier module for use in a multi-band wireless mobile device comprising:
a first semiconductor die including an amplifier circuit configured to amplify a radio frequency input signal received on an input terminal of the power amplifier module for transmission by a first antenna associated with a first transmit path of the mobile device;
an input tuning circuit including at least a first capacitor in communication with the first semiconductor die;
an output tuning circuit including at least a first inductor in communication with an output terminal of the power amplifier module; and
a first circuit connected in series between the input tuning circuit and the output tuning circuit and including at least a second inductor and a second capacitor connected in parallel and configured to transform an output impedance of the amplifier circuit to an input impedance of the first antenna and further configured to block signals radiating from a second antenna associated with a second transmit path of the mobile device and received at the output terminal from traveling backwards along the first transmit path to the amplifier circuit.

2. The module of claim 1 wherein the first circuit includes a plurality of integrated passive devices included in a common package.

3. The module of claim 1 wherein the first circuit includes a plurality of surface mount devices.

4. The module of claim 1 wherein the first circuit is implemented in a second semiconductor die separate from the first semiconductor die.

5. The module of claim 1 wherein the first semiconductor die does not include an output matching network.

6. The module of claim 1 wherein the first circuit includes a concurrent output matching network and filter circuit configured to concurrently transform the output impedance of the amplifier circuit from approximately 6 ohms to approximately 50 ohms, and block the signals received at the output terminal from the second antenna from propagating backwards through the first transmit path.

7. The module of claim 1 wherein the first circuit includes a first impedance matching network configured to transform the output impedance of the amplifier circuit from approximately 6 ohms to approximately 12 ohms.

8. The module of claim 7 wherein the first circuit further includes a concurrent output matching network and filter circuit configured to concurrently transform the output impedance of the first impedance matching network from the approximately 12 ohms to approximately 50 ohms, and block the signals received at the output terminal from the second antenna from propagating backwards through the first transmit path, the first impedance matching network being separate from the concurrent output matching network and filter circuit.

9. The module of claim 1 wherein the first circuit further includes a third inductor and a third capacitor connected in parallel, the parallel combination of the second inductor and the second capacitor and the parallel combination of the third inductor and the third capacitor connected in series and having a common terminal.

10. The module of claim 9 wherein the first circuit further includes a fourth capacitor connected in series with a fourth inductor, the series combination of the fourth capacitor and the fourth inductor coupled between the common terminal and ground.

11. The module of claim 10 wherein the first circuit further includes a fifth inductor connected between the input of the first circuit and the ground, and a sixth inductor connected between the output of the first circuit and the ground.

12. The module of claim 1 wherein the first circuit has impedance matching and filtering functionalities, the first circuit configured to function as both an output matching network and at least one filter such that signal losses associated with the first circuit are less than signal losses associated with the output matching network and the at least one filter implemented separately, and such that a size of the first circuit is less than a size of the output matching network and the at least one filter implemented separately.

13. A multi-band wireless mobile device comprising:
first and second antennas associated with first and second radio frequency transmit paths, respectively;
a transmit/receive switch configured to pass a radio frequency output signal to the first antenna for transmission; and
a radio frequency power amplifier module including a first semiconductor die including an amplifier circuit configured to amplify a radio frequency input signal for transmission by the first antenna, an input tuning circuit including at least a first capacitor in communication with the first semiconductor die, an output tuning circuit including at least a first inductor, and a first circuit connected in series between the input tuning circuit and the output tuning circuit and including at least a second inductor and a second capacitor connected in parallel and configured to transform an output impedance of the amplifier circuit to an input impedance of the first antenna and further configured to block signals radiating from a second antenna associated with the second transmit path from traveling backwards along the first transmit path to the amplifier circuit when the transmit/receive switch is configured to transmit.

14. The wireless mobile device of claim 13 wherein the first circuit includes a plurality of integrated passive devices included in a common package.

15. The wireless mobile device of claim 13 wherein the first semiconductor die does not include any impedance matching functionality.

16. The wireless mobile device of claim 13 wherein the first circuit includes a concurrent output matching network and filter circuit configured to concurrently transform the output impedance of the amplifier circuit from approximately 6 ohms to approximately 50 ohms, and block the signals received from the second antenna from propagating backwards through the first transmit path.

17. The wireless mobile device of claim 13 wherein the first circuit includes a first impedance matching network configured to transform the output impedance of the amplifier circuit from approximately 6 ohms to approximately 12 ohms.

18. The wireless mobile device of claim 17 wherein the first circuit includes a concurrent output matching network and filter circuit configured to concurrently transform the output impedance of the first impedance matching network from the approximately 12 ohms to approximately 50 ohms, and block the signals received from the second antenna from propagating backwards through the first transmit path, the first impedance matching network being separate from the concurrent output matching network and filter circuit.

19. A method to reduce intermodulation in a radio frequency output signal in a multi-band wireless mobile device, the method comprising:

amplifying, with a power amplifier circuit residing on a first semiconductor die, a radio frequency input signal to provide an amplified radio frequency signal for transmission by a first antenna in a first radio frequency path, the power amplifier circuit connected to an input tuning circuit including at least a first capacitor and that is in communication with the first semiconductor die;

transforming, with a first circuit connected in series between the input tuning circuit and an output tuning circuit that includes at least a first inductor, an output impedance of the power amplifier circuit to approximate an input impedance of the first antenna, the first circuit including at least a second capacitor and a second inductor;

concurrently with the transforming, blocking with the first circuit signals radiating from a second antenna associated with a second radio frequency path from traveling backwards along the first radio frequency path to the power amplifier circuit;

tuning an input impedance of the first circuit with the input tuning circuit; and tuning an output impedance of the first circuit with the output tuning circuit.

20. The method of claim 19 wherein the power amplifier circuit is implemented on the first semiconductor die and the single circuit is not implemented on the first semiconductor die.

21. The method of claim 20 wherein the first circuit is implemented on a second semiconductor die that is separate from the first semiconductor die.

22. The method of claim 20 wherein the first circuit is configured to function as both an output matching network and at least one filter such that signal losses associated with the first circuit are less than signal losses associated with the output matching network and the at least one filter implemented separately, and such that a size of the first circuit is less than a size of the output matching network and the at least one filter implemented separately.

* * * * *